United States Patent
Okamoto et al.

(10) Patent No.: US 9,203,678 B2
(45) Date of Patent: Dec. 1, 2015

(54) RECEIVING DEVICE, RECEIVING METHOD, PROGRAM, AND RECEIVING SYSTEM

(75) Inventors: Takuya Okamoto, Chiba (JP); Hiroo Takahashi, Tokyo (JP); Yuken Goto, Tokyo (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/006,871

(22) PCT Filed: Mar. 23, 2012

(86) PCT No.: PCT/JP2012/057528
§ 371 (c)(1),
(2), (4) Date: Sep. 23, 2013

(87) PCT Pub. No.: WO2012/133193
PCT Pub. Date: Oct. 4, 2012

(65) Prior Publication Data
US 2014/0010332 A1    Jan. 9, 2014

(30) Foreign Application Priority Data
Mar. 31, 2011 (JP) ................................. 2011-080120

(51) Int. Cl.
| | |
|---|---|
| H04L 27/26 | (2006.01) |
| H04B 1/28 | (2006.01) |
| H03J 7/02 | (2006.01) |
| H04N 5/44 | (2011.01) |
| H04N 5/455 | (2006.01) |

(52) U.S. Cl.
CPC .............. H04L 27/2666 (2013.01); H03J 7/02 (2013.01); H04B 1/28 (2013.01); H04N 5/4401 (2013.01); H04N 5/455 (2013.01)

(58) Field of Classification Search
CPC ...................................................... H04L 27/26
USPC .......................................... 375/267, 316, 324
See application file for complete search history.

(56) References Cited

U.S. PATENT DOCUMENTS

| | | | |
|---|---|---|---|
| 6,026,129 A | 2/2000 | Ohta et al. | |
| 8,330,873 B2 * | 12/2012 | Silver et al. | 348/731 |
| 8,570,446 B2 * | 10/2013 | Ouslis et al. | 348/735 |
| 2005/0107059 A1 * | 5/2005 | Lehning et al. | 455/303 |
| 2008/0225182 A1 * | 9/2008 | Silver et al. | 348/726 |
| 2008/0231759 A1 * | 9/2008 | Cowley et al. | 348/731 |
| 2009/0304023 A1 | 12/2009 | Stadelmeier et al. | |
| 2010/0034219 A1 * | 2/2010 | Stadelmeier et al. | 370/478 |
| 2012/0314790 A1 * | 12/2012 | Stadelmeier et al. | 375/267 |

FOREIGN PATENT DOCUMENTS

| | | |
|---|---|---|
| JP | 09-266452 A | 10/1997 |
| JP | 2009-296586 A | 12/2009 |

OTHER PUBLICATIONS

International Search Report issued May 29, 2012 in PCT/JP2012/057528.
"Digital Video Broadcasting (DVB); Frame structure channel coding and modulation for a second generation digital transmission system for cable systems (DVB-C2)" DVB, vol. A138, Jun. 2010, 111 Pages.

* cited by examiner

*Primary Examiner* — Jaison Joseph
(74) *Attorney, Agent, or Firm* — Oblon, McClelland, Maier & Neustadt, L.L.P.

(57) ABSTRACT

The present technology relates to a receiving device, a receiving method, a program, and a receiving system which may improve reception performance in the case of receiving a signal with a variable frequency band. A receiving device according to an embodiment of the present technology includes a demodulation unit configured to convert a received signal to a baseband signal in the case where a first frequency differs from a second frequency, wherein the first frequency is a center frequency in a band of the received signal, the second frequency is a center frequency in a band of a desired signal included in a part of the band of the received signal, and a DC component of the baseband signal is to be a frequency in the vicinity of the second frequency. The present technology may be applied to a receiver which receives an OFDM signal of DVB-C2.

15 Claims, 27 Drawing Sheets

FIG. 5

| | Field | Size (bits) |
|---|---|---|
| 1 | NETWORK_ID | 16 |
| 2 | C2_SYSTEM_ID | 16 |
| 3 | START_FREQUENCY | 24 |
| 4 | C2_BANDWIDTH | 16 |
| 5 | GUARD_INTERVAL | 2 |
| 6 | C2_FRAME_LENGTH | 10 |
| 7 | L1_PART2_CHANGE_COUNTER | 8 |
| 8 | NUM_DSLICE | 8 |
| 9 | NUM_NOTCH | 4 |
| 10 | for i=0..NUM_DSLICE-1 { | |
| 11 |     DSLICE_ID | 8 |
| 12 |     DSLICE_TUNE_POS | 14 or 13 |
| 13 |     DSLICE_OFFSET_LEFT | 9 or 8 |
| 14 |     DSLICE_OFFSET_RIGHT | 9 or 8 |
| 15 |     DSLICE_TI_DEPTH | 2 |
| 16 |     DSLICE_TYPE | 1 |
| 17 |     if DSLICE_TYPE=='1' { | |
| 18 |         FEC_HEADER_TYPE | 1 |
| 19 |     } | |
| 20 |     DSLICE_CONST_CONF | 1 |
| 21 |     DSLICE_LEFT_NOTCH | 1 |
| 22 |     DSLICE_NUM_PLP | 8 |
| 23 |     for i=0..DSLICE_NUM_PLP-1 { | |
| 24 |         PLP_ID | 8 |
| 25 |         PLP_BUNDLED | 1 |
| 26 |         PLP_TYPE | 2 |
| 27 |         PLP_PAYLOAD_TYPE | 5 |
| 28 |         if PLP_TYPE=='00' or '01' { | |
| 29 |             PLP_GROUP_ID | 8 |
| 30 |         } | |
| 31 |         if DSLICE_TYPE=='0' { | |
| 32 |             PLP_START | 14 |
| 33 |             PLP_FEC_TYPE | 1 |
| 34 |             PLP_MOD | 3 |
| 35 |             PLP_COD | 3 |
| 36 |         } | |
| 37 |         PSI/SI_REPROCESSING | 1 |
| 38 |         if PSI/SI_REPROCESSING=='0' { | |
| 39 |             transport_stream_id | 16 |
| 40 |             original_network_id | 16 |
| 41 |         } | |
| 42 |         RESERVED_1 | 8 |
| 43 |     } | |
| 44 |     RESERVED_2 | 8 |
| 45 | } | |
| 46 | for i=0..NUM_NOTCH-1 { | |
| 47 |     NOTCH_START | 14 or 13 |
| 48 |     NOTCH_WIDTH | 9 or 8 |
| 49 |     RESERVED_3 | 8 |
| 50 | } | |
| 51 | RESERVED_TONE | 1 |
| 52 | RESERVED_4 | 16 |

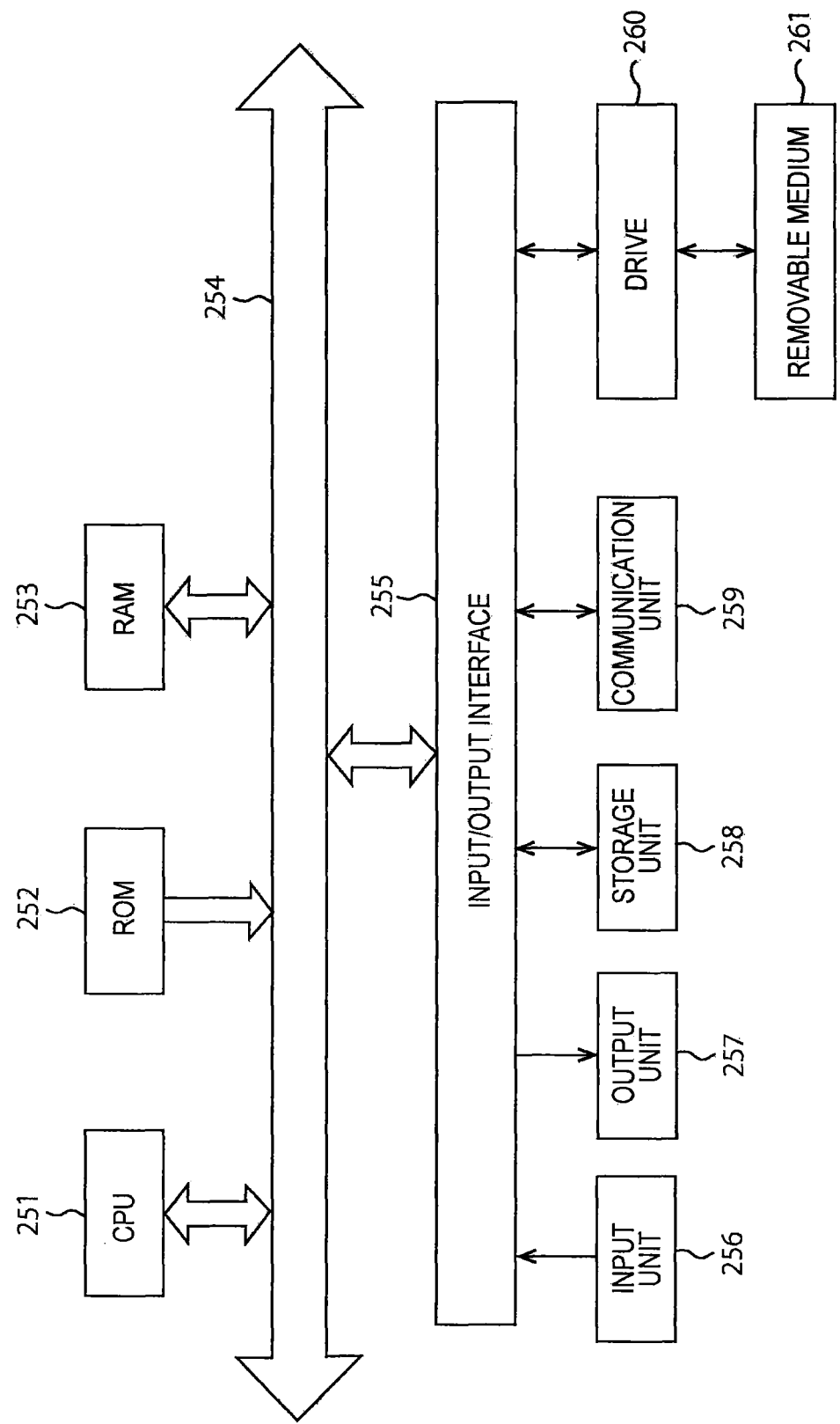

RECEIVING DEVICE, RECEIVING METHOD, PROGRAM, AND RECEIVING SYSTEM

TECHNICAL FIELD

The present technology relates to a receiving device, a receiving method, a program, and a receiving system capable of improving reception performance, particularly in the case of receiving a signal with a variable frequency band.

BACKGROUND ART

In terrestrial digital broadcasting, for example, channels (physical channels) are generally defined to be spaced at constant frequency intervals so as to transmit an independent signal with a bandwidth prescribed by laws and regulations. In view of inter-channel interference and so on, a guard band with a predetermined bandwidth is established between channels.

For example, in the case of DVB-T/T2 which is the European terrestrial digital broadcasting standard, the bandwidth of each channel is 8 MHz as illustrated in FIG. 1A. A receiver is to be designed on the premise that a signal with such a predetermined bandwidth is transmitted.

For example, in the event that interference wave exists in a part of some channels (physical channels), transmission operators that transmit signals using this kind of transmission system have chosen not to use an entire band in which the interference wave exists. This results in wasteful use of the frequency band.

Meanwhile, DVB-C2, standardized in 2010 as the European second-generation cable digital broadcasting standard, includes an arrangement configured to avoid such a wasteful use of the frequency band (Non-Patent Document 1).

As illustrated in FIG. 1B, DVB-C2 supports a concept of data slice, and a predetermined number of such data slices are combined to configure a C2 system. Each data slice has a bandwidth of 3408 carriers or less and is allowed to be freely combined as far as the conditions specified by the standard are fulfilled.

Further, DVB-C2 supports a concept of a notch. The transmission operators define, as a notch, a band unavailable due to external interference, etc., and the C2 system may include information regarding the notch position expressed in units of subcarriers.

FIG. 2A is a diagram illustrating an example of a DVB-T/T2 signal, and FIG. 2B is a diagram illustrating an example of a DVB-C2 signal. In FIG. 2, a horizontal axis indicates a frequency. A description will be given for the signal of DVB-C2.

As shown in parts enclosed by lines in FIG. 2B, the C2 system includes a preamble symbol and a data symbol. According to the standard, one C2 system is a signal with a bandwidth up to approximately 3.5 GHz.

A preamble symbol is a symbol used to transmit transmission control information called L1 signaling part 2 data (L1 information). The L1 information will be described later in detail. The same information is repeatedly transmitted at the cycle of 3408 carriers (cycle of 3408 subcarriers of OFDM (Orthogonal Frequency Division Multiplex)) using the preamble symbol. The 3408 carriers corresponds to a 7.61 MHz frequency band.

A data symbol is a symbol used to transmit TS (Transport Streams) such as program data. The data symbol is divided for each data slice. For example, data slice 1 (DS1) and data slice 2 (DS2) transmit different pieces of program data. The parameters relating to each data slice, such as the number of data slices, are contained in the L1 information.

The portions painted in black in FIG. 2B indicate the notches. The notches are frequency bands used for FM broadcasting, police radio, military radio, etc. but not used to transmit the C2 system signals. In a transmission signal output from a transmitter, the notch periods are signal-free periods. There are two types of the notches, that is, a narrowband notch having less than 48 carriers in bandwidth and a broadband notch having 48 carriers or more in bandwidth. The parameters related to the respective notches, such as the number of notches and the bandwidth thereof, are contained in the L1 information.

Thus, the DVB-C2 signal includes the "data slices" and the "notches" that are variable in bandwidth. It is necessary for the receiver to demodulate an OFDM signal whose bandwidth is selected almost at discretion of the transmitting side. In DVB-C2, there is a case where a width of a desired data slice may be smaller than 3408 carriers. The carrier number of the desired data slice is acquired from the L1 information during channel scan.

A receiving process in the receiver is conducted by receiving a signal within a tuning window that has a fixed bandwidth (3409 carriers) as illustrated in FIG. 3A. The center position (center frequency) of the tuning window suitable for receiving a signal of the desired data slice is specified by the L1 information from the transmitting side.

In the receiver, the OFDM signal is demodulated by performing orthogonal demodulation using the signal with the frequency specified by the transmitting side. The program data is decoded based on the L1 information obtained from the demodulation.

CITATION LIST

Non-Patent Document

Non-Patent Document 1: DVB-C2 STANDARD [Digital Video Broadcasting (DVB); Frame structure channel coding and modulation for a second generation digital transmission system for cable systems (DVB-C2)] DVB Document A138

SUMMARY OF THE INVENTION

Problems to be Solved by the Invention

In general, an OFDM signal of a desired data slice may be demodulated by down-converting the OFDM signal to a baseband signal whose frequency has been specified by the transmitting side. This may be achieved by demodulating a received signal and retrieving a necessary portion, namely an OFDM signal, in accordance with placement information of the OFDM signal contained in the L1 information. The OFDM signal is used to transmit a data symbol which constitutes a desired data slice.

However, in the case where the desired data slice is a dependent static DS of DVB-C2 and a notch (broadband notch) is included in the band of the received signal, demodulation sometimes may not be conducted. Here, an expression "dependent static DS" refers to, so to speak, a data slice which is a slave of other data slice because the dependent static DS may be demodulated only after obtaining the L1 information from the band of the other data slice (DS).

The dependent static DS is a data slice separate from a group of other data slices, such as DS8 illustrated in FIG. 2B.

The dependent static DS includes sometimes one data slice and sometimes a group of data slices including a plurality of data slices.

In the event of receiving the dependent static DS, no matter how a tuning window is selected, there is a broadband notch within the band of the received signal or a portion outside the band of the C2 system as illustrated in FIG. 3B. Even if the band including the dependent static DS is received and demodulated, it is not guaranteed that L1 information can be decoded. Meanwhile, it should be noted that, in DVB-C2, the broadband notch is basically included in the band of the received signal only in the case where the data slice to be received is the dependent static DS.

For example, demodulation may not be correctly conducted in the case where the band of the dependent static DS is located in a position biased to a high-frequency band or a low frequency band in the band of the received signal. As described later, when demodulating the OFDM signal, GI correlation is calculated by using an OFDM symbol to correct a carrier frequency error. However, if there is any clock frequency error when the band of the dependent static DS is in a biased position, a correct correction value may not be obtained.

The present technology has been provided in consideration of the foregoing circumstances and is directed to improving reception performance in the case of receiving a signal with a variable frequency band.

Solutions to Problems

A receiving device according to an embodiment of the present technology includes a demodulation unit configured to convert a received signal to a baseband signal in the case where a first frequency differs from a second frequency, wherein the first frequency is a center frequency in a band of the received signal, the second frequency is a center frequency in a band of a desired signal contained in a part of the band of the received signal, and a DC component of the baseband signal is to be a frequency in the vicinity of the second frequency.

The receiving device may be a piece of an IC chip, a component including an IC chip, or a device including a component including an IC chip.

The band of the desired signal may include a band of a signal to be received and a band of an adjacent signal adjacent to the band of the signal to be received.

In the case where the first frequency differs from the second frequency, the demodulating unit may convert the received signal to the baseband signal when either one of both ends of the signal to be received is adjacent to the adjacent signal.

Further, a setting unit may be provided to specify the first frequency and the second frequency based on transmission control information contained in the received signal and set a frequency which is to be the DC component of the baseband signal. In this case, the demodulation unit may convert the received signal in accordance with the frequency set by the setting unit.

Further, a receiving unit may be provided to receive a signal with a fixed bandwidth in a predetermined frequency band which includes a bandwidth of a signal used for transmitting the transmission control information. In this case, the demodulation unit may convert the received signal received by the receiving unit to the baseband signal.

Further, a processing unit may be provided to suppress a signal in a band other than the band of the desired signal. In this case, the demodulation unit may convert the received signal, for which the signal has been suppressed by the processing unit, to the baseband signal.

The band whose center frequency is the first frequency may be a band of a DVB-C2 tuning window, and the band of the desired signal may be a band of an OFDM signal which includes, at least in part, an OFDM signal of a data slice to be received.

In the case where the band of the desired signal is interposed between a band outside a C2 system and a band of a notch, the demodulation unit may convert the received signal to the baseband signal. A DC component of the baseband signal is to be a frequency closer to the band outside the C2 system than the center frequency in the band of the desired signal.

Effects of the Invention

The present technology may improve reception performance in the case of receiving a signal with a variable frequency band.

BRIEF DESCRIPTION OF DRAWINGS

FIG. 5 is a diagram showing parameters included in L1 information.

FIG. 27 is a diagram illustrating an exemplary structure of a computer.

MODES FOR CARRYING OUT THE INVENTION

Hereinafter, the modes for carrying out the present technology will be described. A description will be given in the following order.
1. Configuration and Operation of Receiving Device
2. Effects
3. Modified Examples
<Configuration and Operation of Receiving Device>
[Exemplary Structure of Receiving Device]

Figure 1:
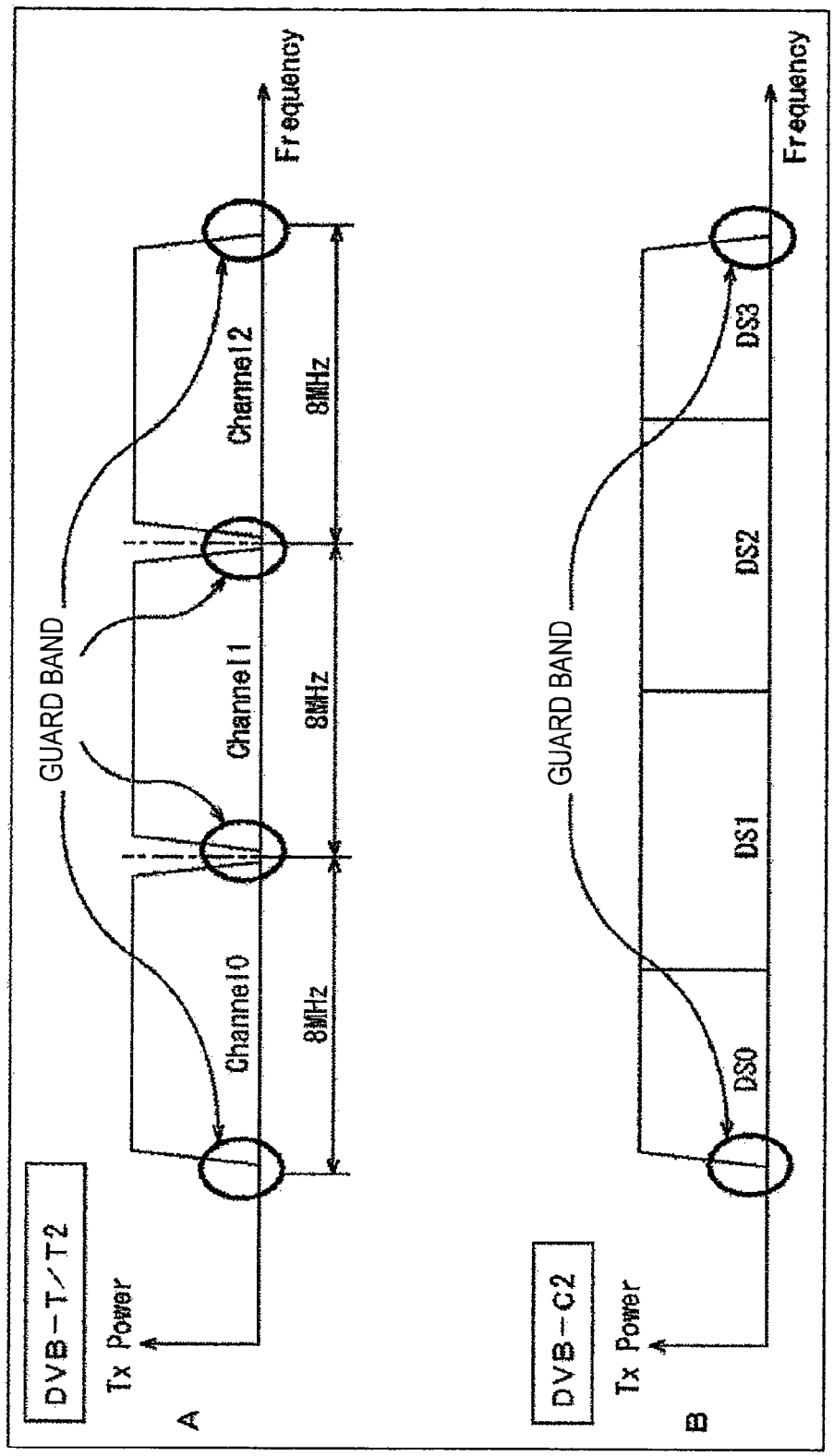
FIG. 1 is a diagram illustrating spectra of DVB-T/T2 and DVB-C2 signals.
Figure 2:
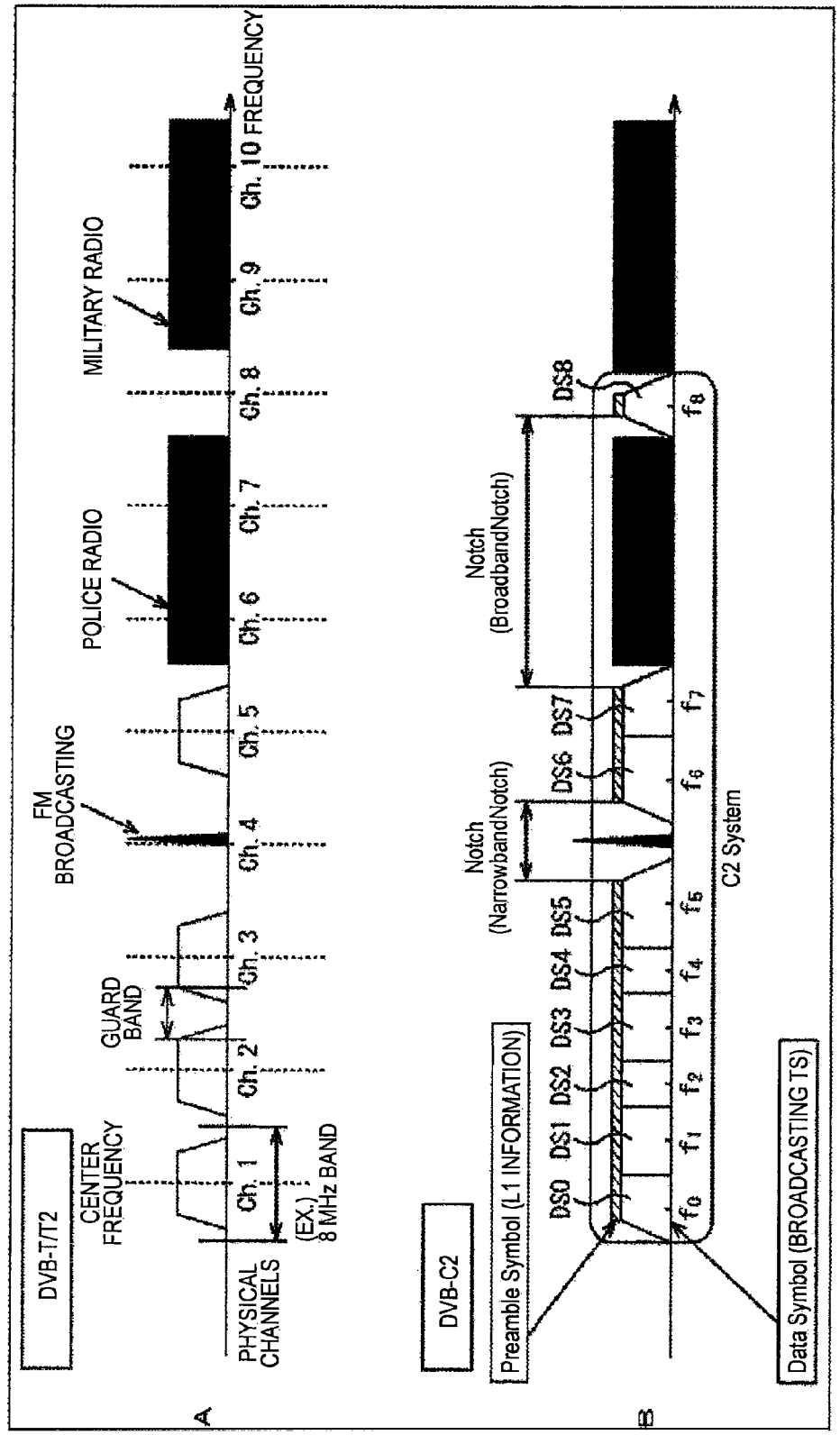
FIG. 2 is a diagram illustrating examples of a C2 system.
Figure 3:
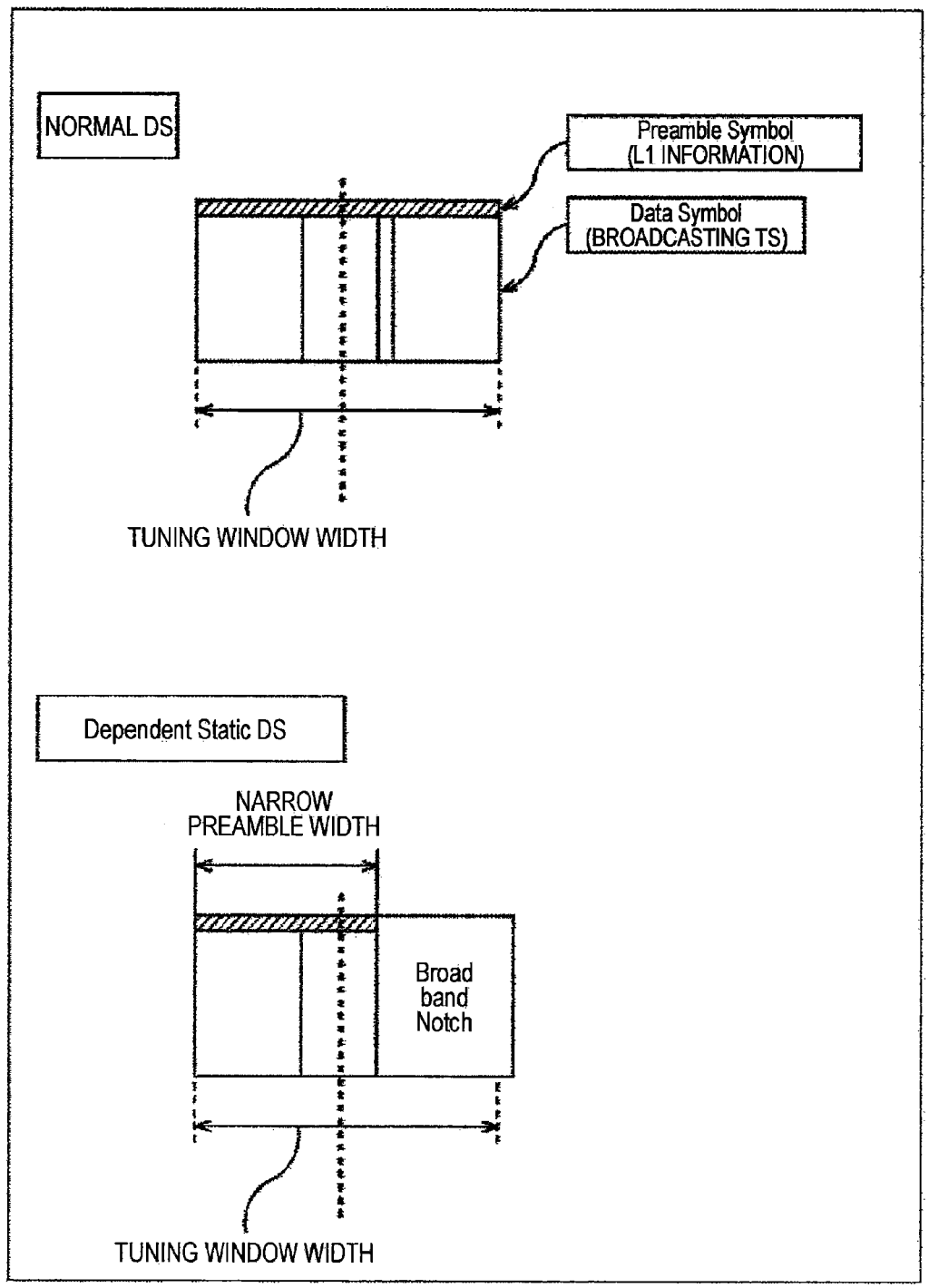
FIG. 3 is a diagram illustrating examples of received signals.
Figure 4:
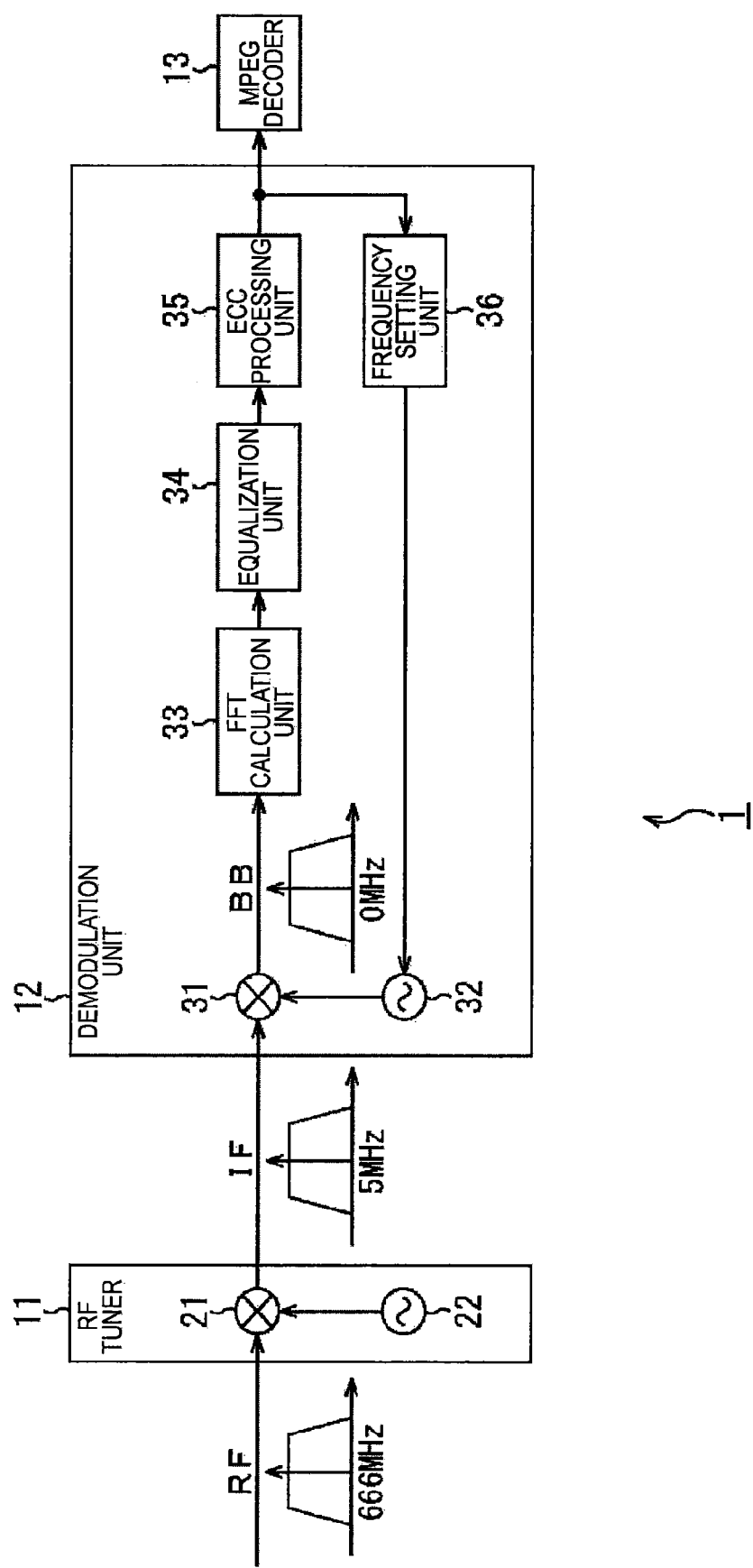
FIG. 4 is a block diagram illustrating a first exemplary structure of a receiving device.

FIG. 4 is a block diagram illustrating a first exemplary structure of a receiving device according to a first embodiment of the present technology.

A receiving device 1 illustrated in FIG. 4 is a Low-IF receiver capable of receiving a DVB-C2 signal. The receiving device 1 includes an RF tuner 11, a demodulation unit 12, and an MPEG decoder 13.

The RF tuner 11 includes a frequency conversion unit 21, and an oscillator 22. The demodulation unit 12 includes an orthogonal demodulation unit 31, an oscillator 32, an FFT calculation unit 33, an equalization unit 34, an ECC processing unit 35, and a frequency setting unit 36. An RF signal representing an OFDM signal of DVB-C2 input to the receiving device 1 via a cable circuit is input to the frequency conversion unit 21 in the RF tuner 11.

The frequency conversion unit 21 in the RF tuner 11 receives the input RF signal and converts the frequency of the RF signal based on a signal supplied from the oscillator 22. The frequency conversion unit 21 outputs, to the orthogonal demodulation unit 31, the IF signal obtained by the frequency conversion.

The oscillator 22 generates a signal of a predetermined frequency according to the tuning window to output the signal to the frequency conversion unit 21.

The orthogonal demodulation unit 31 in the demodulation unit 12 orthogonally demodulates an IF signal supplied from the frequency conversion unit 21 based on a signal supplied from the oscillator 32. The orthogonal demodulation unit 31 outputs, to the FFT calculation unit 33, a baseband signal obtained by performing the orthogonal demodulation. The baseband signal is the time-domain signal representing respective symbols, such as preamble symbol and data symbol configuring a C2 system.

The oscillator 32 generates a signal of the frequency set by the frequency setting unit 36 and outputs the signal to the orthogonal demodulation unit 31.

The FFT calculation unit 33 performs FFT calculation for the baseband signal supplied from the orthogonal demodulation unit 31 and outputs a frequency-domain signal to the equalization unit 34.

The equalization unit 34 extracts a pilot symbol from the frequency-domain signal supplied from the FFT calculation unit 33 and estimates transmitting channel characteristics based on the extracted pilot symbol. The equalization unit 34 removes distortion from the channel based on the estimated transmitting channel characteristics and equalizes the frequency-domain signal supplied from the FFT calculation unit 33, and then outputs the equalized signal to the ECC processing unit 35.

The ECC processing unit 35 performs error correction decoding for the data of each symbol based on BCH and LDPC codes contained in the equalized signal supplied from the equalization unit 34 and then outputs the error correction decoded data. L1 information and TS data obtained by the error correction decoding are output from the ECC processing unit 35 and supplied to the frequency setting unit 36 and the MPEG decoder 13.

For example, in the case where an OFDM signal is included across the band of the received signal, the frequency setting unit 36 outputs, to the oscillator 32, the information of a center frequency of a desired data slice based on the L1 information supplied from the ECC processing unit 35. The desired data slice is a data slice to be received.

FIG. 5 is a diagram illustrating parameters included in the L1 information. A description will be given for the major parameters.

"START_FREQUENCY" in the third row represents the frequency that serves as a start position of the C2 system. The start position is expressed by an absolute frequency starting from 0 Hz. "C2_BANDWIDTH" in the fourth row represents a bandwidth of the C2 system.

"NUM_DSLICE" in the eighth row represents the number of data slices contained in the C2 frame. "NUM_NOTCH" in the ninth row represents the number of notches contained in the C2 frame. The parameters from the 10th to 45th rows are the parameters for the respective data slices.

"DSLICE_ID" in the 11th row represents an ID of the data slice in the C2 system. "DSLICE_TUNE_POS" in the 12th row represents a center frequency of the data slice based on the frequency represented by "START_FREQUENCY".

The parameters from the 46th to 50th rows are given for the respective notches. "NOTCH_START" in the 47th row represents the position of the notch based on the frequency represented by "START_FREQUENCY". "NOTCH_WIDTH" in the 48th row represents the bandwidth of the notch.

The frequency setting unit 36 performs processes such as specifying a center frequency of a desired data slice to be received based on DSLICE_TUNE_POS.

The MPEG decoder 13 decodes the data stored in a TS packet configuring the TS supplied from the ECC processing unit 35 and outputs the decoded data to the subsequent stage. The data stored in the TS packet is compressed in a predetermined compression method, such as MPEG2.

[Regarding Frequency Transition of Signal]

Here, description will be given for frequency transition of a received signal in the case where an OFDM signal is included across a band.

Figure 6:
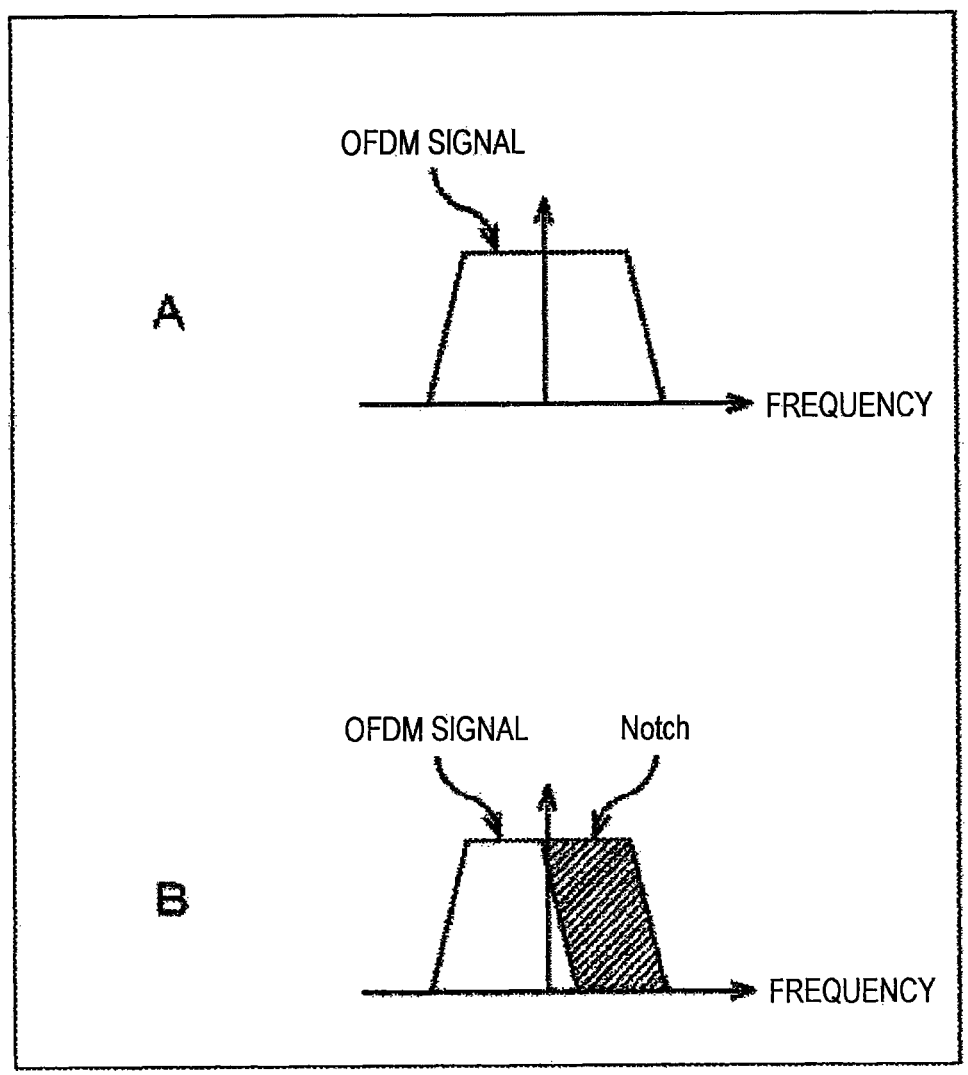
FIG. 6 is a diagram illustrating examples of received signals.

A received signal in the case where the OFDM signal is included across the band is shown in FIG. 6A. In FIG. 6A, an axis along a trapezoid base indicates the frequency, and an up-pointing arrow indicates a center frequency in the band. In the band of the received signal in FIG. 6A, only the OFDM signal is included and no notch is included. The OFDM signal in FIG. 6A includes an OFDM signal of a desired data slice.

In the example in FIG. 4, the RF signal including the OFDM signal across the band is input to the frequency conversion unit 21. A frequency of the RF signal to be input to the frequency conversion unit 21 is 666 MHz, for example, and the RF signal has a predetermined bandwidth, such as 8 MHz, having passed through a bandpass filter (not shown) provided inside the RF tuner 11. The frequency conversion unit 21 converts the RF signal at 666 MHz, for example, to an IF signal at 5 MHz and outputs the IF signal to the orthogonal demodulation unit 31. A description hereinafter will be given assuming that a bandwidth of a tuning window, namely a bandwidth of a received signal, is 8 MHz.

In the case where an OFDM signal is included across the band of the received signal, the frequency setting unit 36 sets, in the oscillator 32, a frequency specified by DSLICE_TUNE_POS in accordance with the DSLICE_TUNE_POS of a desired data slice included in L1 information.

The orthogonal demodulation unit 31 orthogonally demodulates the IF signal based on a signal generated by the oscillator 32 and then down-converts the IF signal to a baseband signal whose DC component is to be a center frequency of the desired data slice. The orthogonal demodulation unit 31 outputs the baseband signal obtained by the orthogonal demodulation. In FIG. 4, the center frequency of the signal to be output from the orthogonal demodulation unit 31 is 0 MHz. This indicates that the signal is the baseband signal.

Thus, in the case where the OFDM signal is included across the band of the received signal, demodulation is performed so that the received signal is down-converted to the baseband signal whose DC component is to be a frequency specified by the DSLICE_TUNE_POS of the desired data slice.

Next, a description is given for frequency transition of a received signal in the case where an OFDM signal is included only in a part of the band.

A received signal in the case where the OFDM signal is included only in a part of the band is shown in FIG. 6B. In the received signal illustrated in FIG. 6B, a shaded portion represents a notch. In the received signal in FIG. 6B, the notch is included in the band of a frequency higher than the center frequency. The OFDM signal included in the received signal in FIG. 6B is the OFDM signal of a dependent static DS, and the OFDM signal of the desired data slice is included at least in a part.

Figure 7:
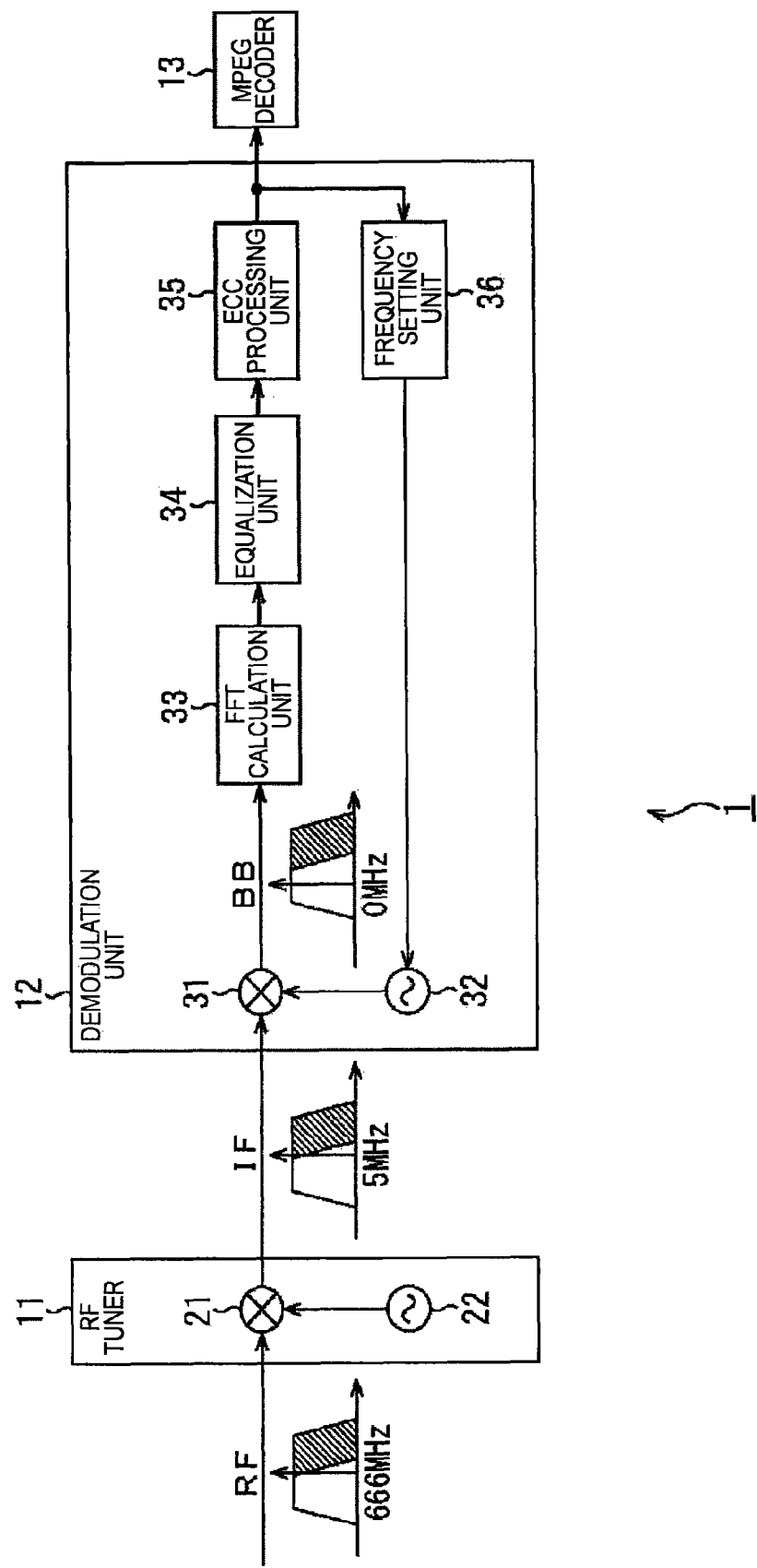
FIG. 7 is a diagram describing frequency transition of a signal.

As illustrated in FIG. 7, an RF signal including the OFDM signal only in a part of the band is input to the frequency conversion unit 21. The frequency of the RF signal to be input to the frequency conversion unit 21 is 666 MHz. The frequency conversion unit 21 converts the RF signal at 666 MHz to an IF signal at 5 MHz and outputs the IF signal to the orthogonal demodulation unit 31.

In the case where the OFDM signal is included only in a part of the band of the received signal, the frequency setting unit 36 specifies, based on L1 information, a center frequency of an entire band of the OFDM signal included in the received signal. Hereinafter, a whole part of the OFDM signal of DVB-C2 included in the received signal will be referred to as a desired OFDM signal as appropriate.

The frequency setting unit 36 sets, in the oscillator 32, the specified center frequency of the desired OFDM signal.

The orthogonal demodulation unit 31 orthogonally demodulates an IF signal based on the signal generated by the oscillator 32 and down-converts the IF signal to a baseband signal whose DC component is to be the center frequency in the band of the desired OFDM signal. The orthogonal demodulation unit 31 outputs the baseband signal obtained by the orthogonal demodulation. In the baseband signal in FIG. 7, an arrow is up-pointed in the center of the band of the desired OFDM signal excluding the band of the notch. This indicates that the baseband signal is a signal whose DC component is to be the center frequency in the band of the desired OFDM signal.

Thus, in the case where the OFDM is included only in a part of the band of the received signal, demodulation is performed so that the received signal is down-converted to the baseband signal whose DC component is to be the center frequency in the band of the desired OFDM signal including the desired data slice, not the frequency specified by the DSLICE_TUNE_POS of the desired data slice.

It may be considered that the transmitting side sets, in the L1 information, information related to an optimal frequency for receiving each data slice. However, the frequency considered to be optimal by the transmitting side may be different from the frequency optimal for demodulation. Therefore, it is preferable to calculate the optimal frequency for demodulation in the receiving side and then perform the down-conversion using the calculated frequency. In the receiving device 1, in the case where the OFDM signal is included only in a part of the band of the received signal, the optimal center frequency is calculated as a center frequency in the band of the desired OFDM signal so as to receive the signal using the calculated optimal frequency.

This results in improvement of reception performance in the case where the desired data slice is included in all or a part of a dependent static DS and the OFDM signal is included only in a part of the band of the received signal. A description will be given later for a reason why reception performance may be improved by down-converting the IF signal to the baseband signal whose DC component is to be the center frequency in the band of the desired OFDM signal, not the center frequency in the band of the received signal.

Meanwhile, it should be noted that the L1 information used in calculating the optimal center frequency is the L1 information received at the time of receiving the data slice (normal data slice) which is not the dependent static DS. In DVB-C2, in the case where the desired data slice is included in all or a part of the dependent static DS, the normal data slice is received first. At the time of receiving the normal data slice, the L1 information may be decoded, and the dependent static DS is received using the L1 information obtained at the time of receiving the normal data slice. As described above, the L1 information may not always be decoded even if the signal in the band including the dependent static DS is received and demodulated.

Concrete Examples

Some concrete examples of the demodulating process will be described.

Figure 8:
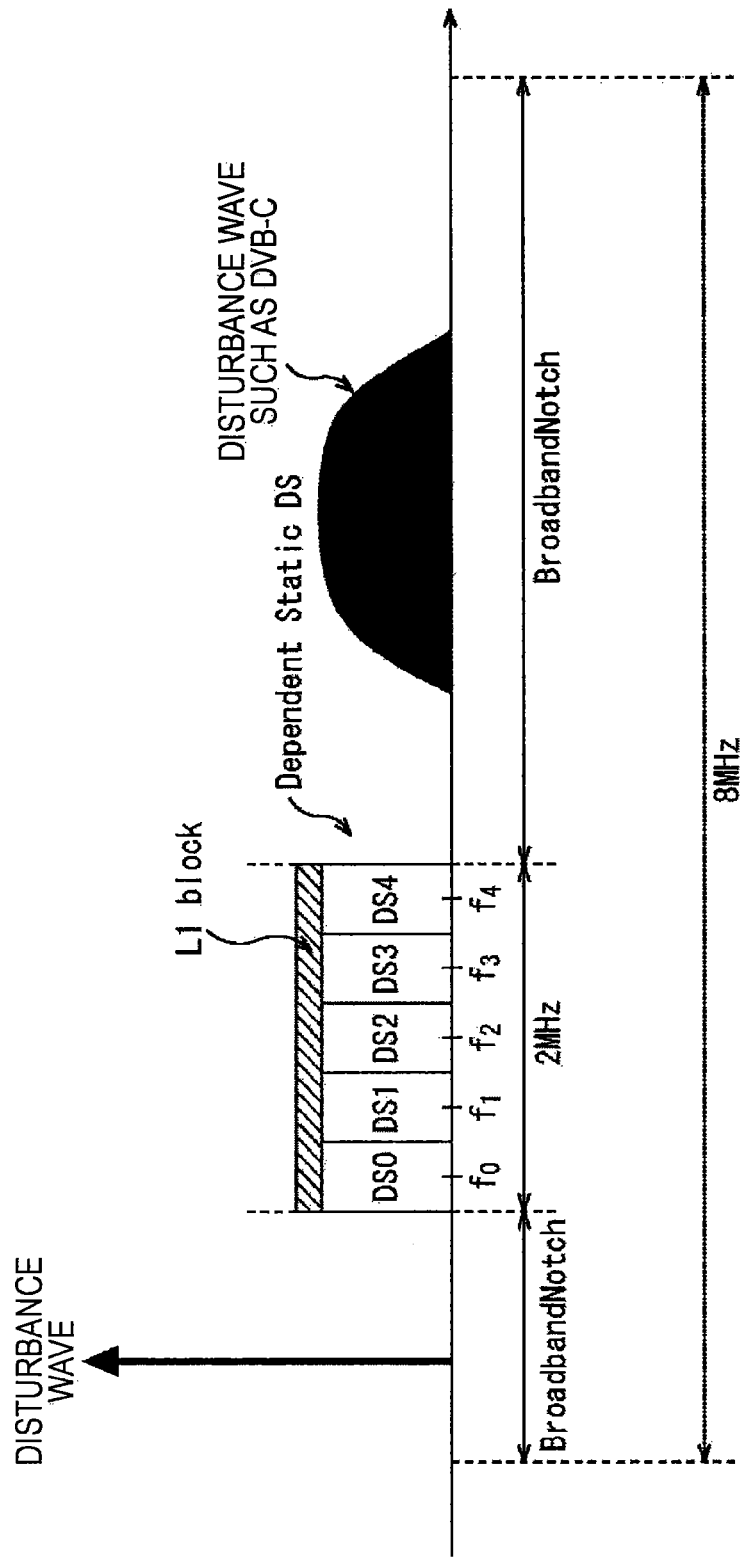
FIG. 8 is a diagram illustrating an example of a transmitting signal.

FIG. 8 is a diagram illustrating an example of a transmitting signal in the transmitting side.

The transmitting signal in FIG. 8 is a signal with 8 MHz bandwidth, and there is dependent static DS interposed between the broadband notches in the frequency band of that signal. In the broadband notch located in the low frequency band on one side of the dependent static DS, local disturbance wave is included. Further, in the broadband notch located in the high frequency band on the other side of the dependent static DS, a signal of other standard, such as DVB-C, is included as the disturbance wave.

In FIG. 8, the bandwidth of the dependent static DS is 2 MHz and includes five data slices DS0 to DS4 having the same bandwidth. The dependent static DS is added with an L1 block which is a preamble symbol block that transmits the L1 information. The L1 information obtained at the time of receiving the normal data slice includes the information of frequencies $f_0$ to $f_4$ which are respectively the center frequencies of the data slices DS0 to DS04.

A description will be given for the case where a desired data slice to be received is the leftmost data slice DS0. A left end of the data slice DS0 contacts the broadband notch and a right end thereof contacts a group of the neighboring data slices, DS1 to DS4. The center frequency of the desired data slice will be different from the center frequency in the band of the desired OFDM signal including the desired data slice. The bandwidth of the desired OFDM signal is 2 MHz.

Figure 9:
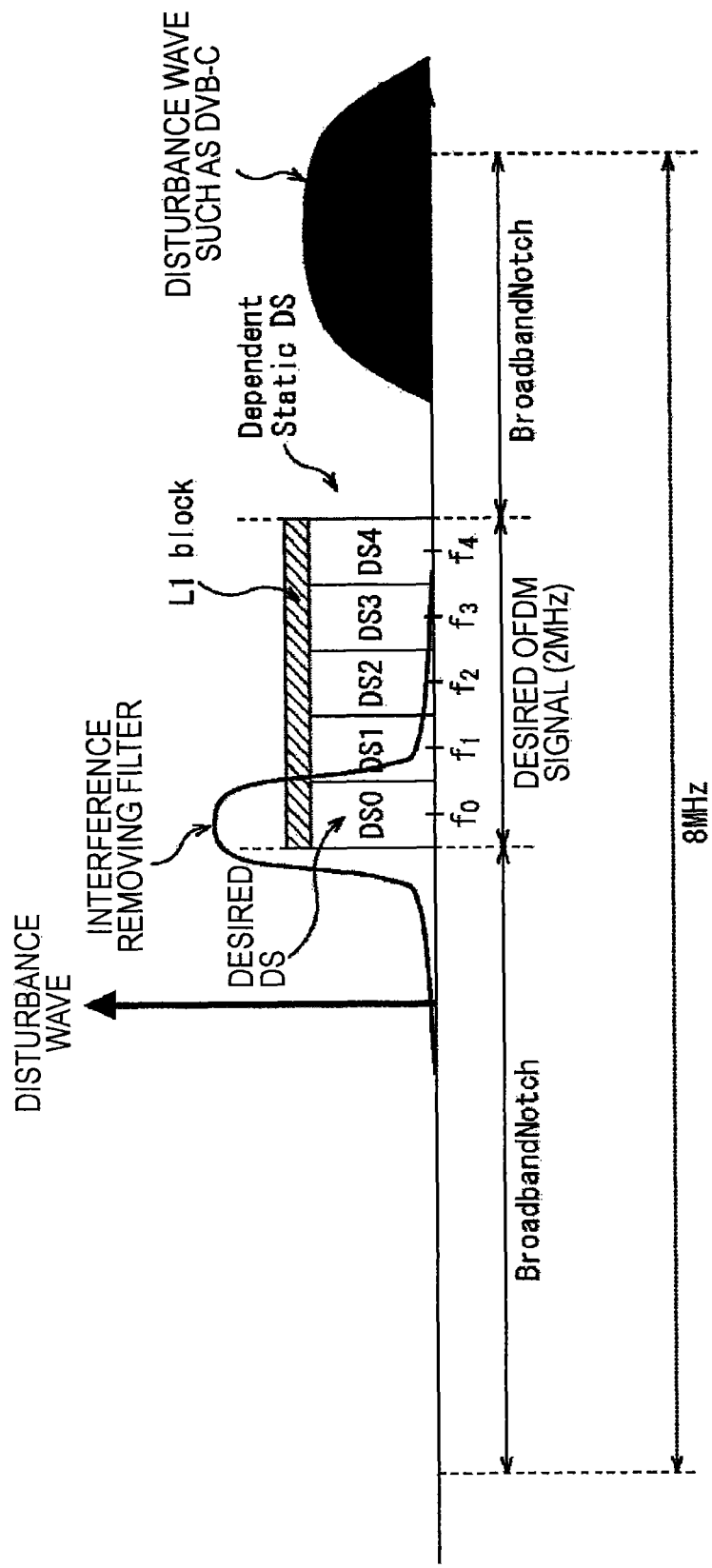
FIG. 9 is a diagram illustrating an exemplary band of a received signal.

FIG. 9 is a diagram illustrating an example of the received signal whose frequency has been shifted so that the center frequency in the band of the received signal may become the same as the center frequency of the desired data slice DS0. In this case, the IF signal is down-converted to the baseband signal whose DC component is a frequency $f_0$, namely the center frequency of DS0.

The band of the desired OFDM signal in FIG. 9 is in a position biased to the right side (high-frequency side) in the band of the received signal.

If the band of the desired OFDM signal is in a biased position in the band of the received signal, reception performance may be degraded. In the case where an interference removing filter is provided to suppress the OFDM signal of the data slice other than DS0 as illustrated in FIG. 9 in order to avoid the degradation of reception performance caused by the biased position of the desired OFDM signal, the number of obtainable continual pilots will be reduced and it may be difficult to conduct demodulation itself. In the data symbol of DVB-C2, a pilot symbol, such as a scattered pilot and the continual pilot, is inserted and used to estimate transmission channel characteristics at the time of demodulation.

Figure 10:
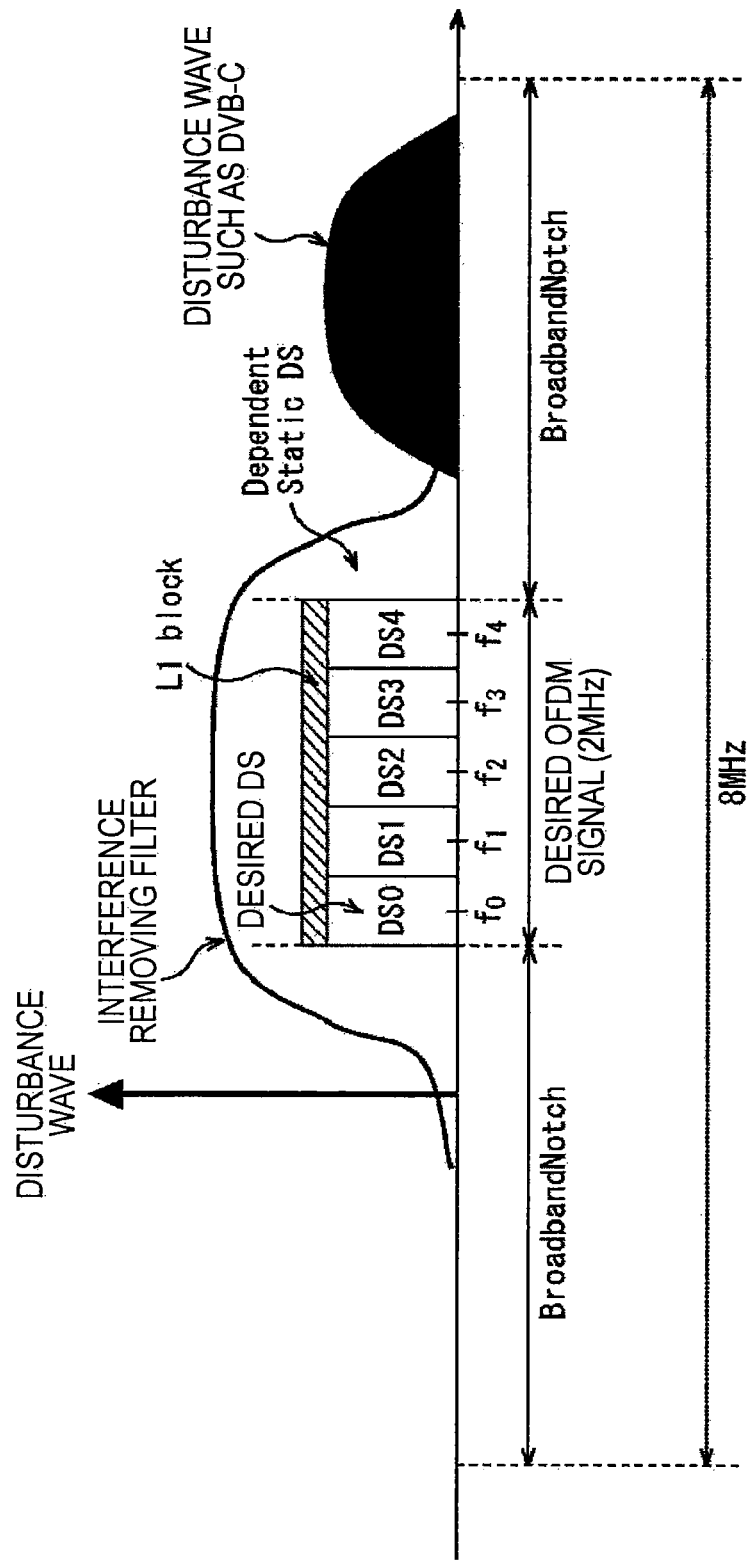
FIG. 10 is a diagram illustrating another exemplary band of the received signal.

FIG. 10 is a diagram illustrating an example of the received signal whose frequency has been shifted so that the center frequency in the band of the received signal may become the same as the center frequency in the band of the desired OFDM signal. In this case, the IF signal is down-converted to a baseband signal whose DC component is a frequency $f_2$, namely the center frequency of DS2 included in the band of the desired OFDM signal.

The band of the desired OFDM signal in FIG. 10 will be positioned in the center of the band of the received signal.

This may avoid the degradation of reception performance caused by the biased position of the desired OFDM signal. Further, even if the interference removing filter is set to suppress the signal other than the OFDM signal of DS0 to DS4, it is possible to obtain as many continual pilots as included in the 2 MHz band, and it would not be difficult to conduct the demodulation itself.

As the center frequency in the band of the received signal, it is also possible to use a frequency in the vicinity of the center frequency of DS2 instead of the center frequency of DS2. If the frequency is closer to the center frequency of DS2 than the center frequency of DS0, the biased position of the OFDM signal in the band of the received signal may be reduced.

The band of the received signal may be shifted so that the center frequency in the band of the received signal would become the same as the center frequency in the band of the desired OFDM signal only when the desired data slice is included in the end portion of the band of the desired OFDM signal as illustrated in FIG. 10, or also when the desired data slice is included in a position other than the end portion of the band of the desired OFDM signal.

[Operation of Receiving Device]

Figure 11:
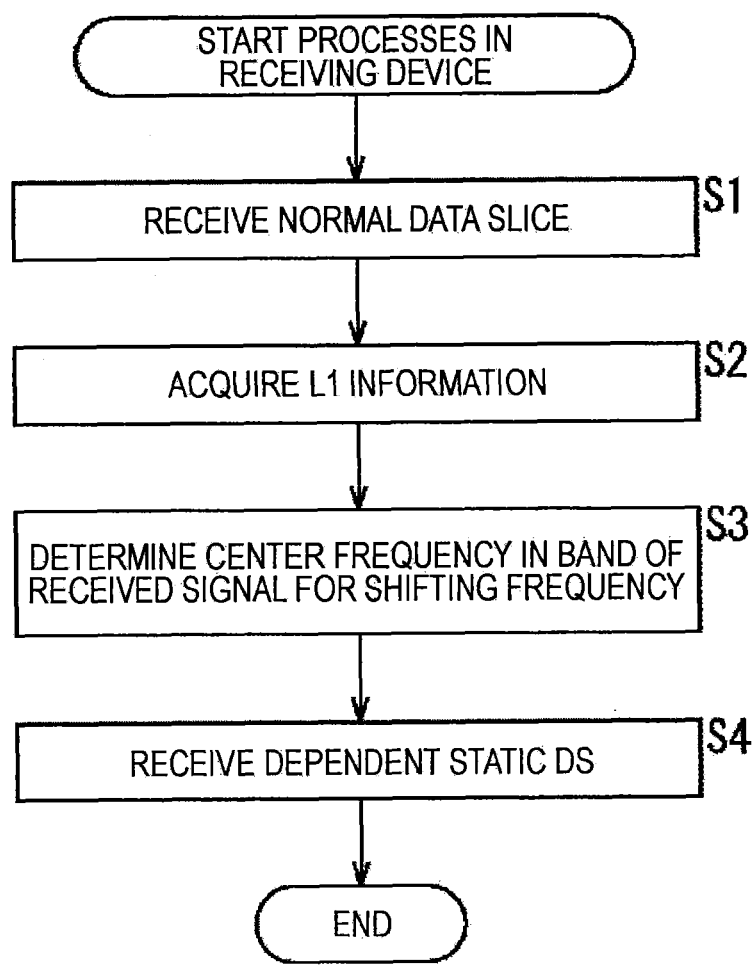
FIG. 11 is a flowchart describing operation of the receiving device.

Here, a description will be given for how the receiving device 1 operates to receive a dependent static DS with reference to a flowchart illustrated in FIG. 11.

In step S1, the receiving device 1 receives a normal data slice in respective units. The signal frequency transition in the respective units of the receiving device 1 in this case is as described with reference to FIG. 4.

That is, the frequency conversion unit 21 in the RF tuner 11 converts an RF signal to an IF signal. The orthogonal demodulation unit 31 in the demodulation unit 12 orthogonally demodulates the IF signal based on a signal supplied from the oscillator 32. As a subject to be received is a normal data slice, orthogonal demodulation by the orthogonal demodulation unit 31 is conducted such that the IF signal is down-converted to a baseband signal whose DC component is to be a center frequency in a band of a received signal. Further, the FFT calculation unit 33 performs FFT calculation for a time-domain baseband signal. The equalization unit 34 equalizes a frequency-domain signal. The ECC processing unit 35 performs error correction decoding for each of the equalized symbol data and outputs the error correction decoded data.

In step S2, the frequency setting unit 36 acquires L1 information output from the ECC processing unit 35 as the error correction decoded data at the time of receiving the normal data slice.

In step S3, the frequency setting unit 36 determines, as a center frequency in the band of the desired OFDM signal, a center frequency in the band of the received signal to receive a dependent static DS, as has been described with reference to FIG. 10.

In step S4, the receiving device 1 receives the dependent static DS in the respective units. The signal frequency transition in the respective units of the receiving device 1 in this case is the same as has been described with reference to FIG. 7.

That is, the frequency conversion unit 21 in the RF tuner 11 converts the RF signal to the IF signal. The orthogonal demodulation unit 31 in the demodulation unit 12 orthogonally demodulates the IF signal based on a signal supplied from the oscillator 32. As a subject to be received is a dependent static DS, orthogonal demodulation by the orthogonal demodulation unit 31 is conducted such that the IF signal is down-converted to the baseband signal whose DC component is to be a center frequency in a band of a desired OFDM signal. Further, the FFT calculation unit 33 performs FFT calculation for a time-domain baseband signal. The equalization unit 34 equalizes a frequency-domain signal. The ECC processing unit 35 performs error correction decoding for each of the equalized symbol data and outputs the error correction decoded data.

With the above series of processes, the receiving device 1 may improve the reception performance at the time of receiving the dependent static DS.

<Effects>

Here, a description is given for the reason why the reception performance may be improved by shifting the band of the received signal at time receiving the dependent static DS as described above.

Figure 12:
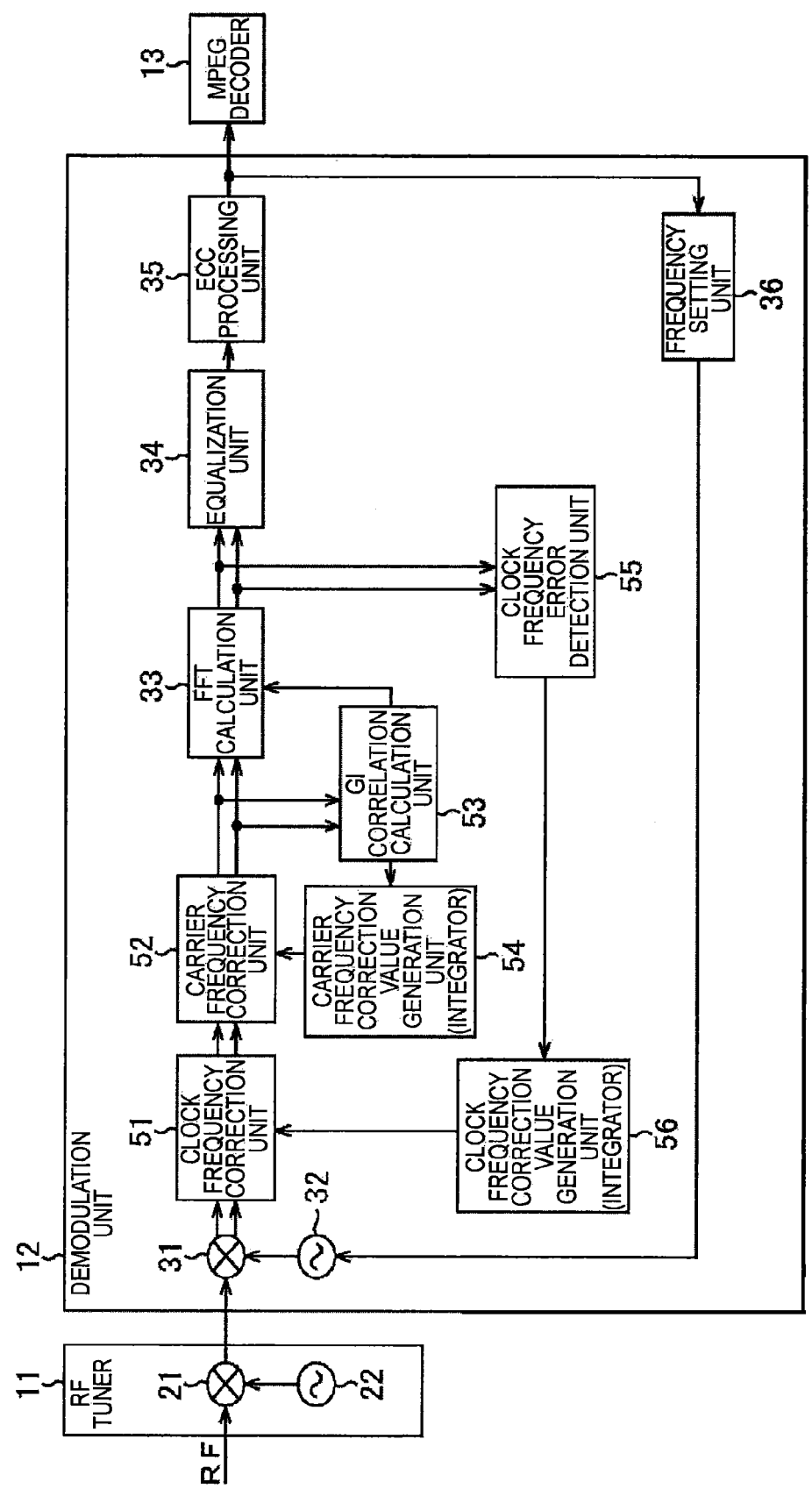
FIG. 12 is a block diagram illustrating an exemplary structure of the receiving device in detail.

FIG. 12 is a block diagram illustrating an exemplary structure of the receiving device 1 in detail. The components illustrated in FIG. 12 identical to those illustrated in FIG. 4 are denoted by the same reference numerals. Therefore, overlapping description will be omitted as appropriate.

The demodulation unit 12 in FIG. 12 includes, in addition to the components in FIG. 4, a clock frequency correction unit 51, a carrier frequency correction unit 52, a GI correlation calculation unit 53, a carrier frequency correction value generation unit 54, a clock frequency error detection unit 55, and a clock frequency correction value generation unit 56. The time-domain OFDM signal, which is the baseband signal obtained by the orthogonal demodulation in the orthogonal demodulation unit 31, is supplied to the clock frequency correction unit 51. Further, the frequency-domain OFDM signal obtained by the FFT calculation in the FFT calculation unit 33 is supplied to the clock frequency error detection unit 55.

The clock frequency correction unit 51 corrects a clock frequency error (sampling frequency error) contained in the time-domain OFDM signal supplied from the orthogonal demodulation unit 31 in accordance with the clock frequency correction value supplied from clock frequency correction value generation unit 56. The received signal to be supplied to the clock frequency correction unit 51 includes a real-axis component (I component) and an imaginary-axis component (Q component). The clock frequency correction unit 51 outputs, to the carrier frequency correction unit 52, the time-domain OFDM signal corrected by the clock frequency error correction.

The carrier frequency correction unit 52 corrects a carrier frequency error contained in the time-domain OFDM signal supplied from the clock frequency correction unit 51 in accordance with a carrier frequency correction value supplied from the carrier frequency correction value generation unit 54. The carrier frequency correction unit 52 outputs, to the FFT calculation unit 33 and the GI correlation calculation unit 53, the time-domain OFDM signal corrected by the carrier frequency error correction.

The GI correlation calculation unit 53 obtains, as a GI correlation (autocorrelation), an average of time duration corresponding to a GI length, for example. The GI correlation is a value obtained by multiplying the time-domain OFDM signal by a delay signal. The delay signal is a signal delayed by a length of an effective symbol of the time-domain OFDM signal supplied from the carrier frequency correction unit 52. The GI correlation thus obtained takes a peak value at the boundary between the OFDM symbols.

A phase of the GI correlation taking the peak value becomes zero in the case where a carrier frequency used for digital orthogonal demodulation perfectly matches a center frequency of the OFDM signal (received OFDM signal) to be digitally and orthogonally demodulated. However, in the case where the carrier frequency used for the digital orthogonal demodulation differs from the center frequency of the OFDM signal to be digitally and orthogonally demodulated, the phase of the GI correlation taking the peak value is rotated accordingly.

Therefore, the phase of the GI correlation taking the peak value is to represent an amount of difference between the carrier frequency used for the digital orthogonal demodulation and the center frequency of the OFDM signal to be digitally and orthogonally demodulated. The carrier frequency correction value generation unit 54 estimates a carrier frequency error based on a phase of the GI correlation taking the peak value, and outputs the estimated amount of the carrier frequency error to the carrier frequency correction value generation unit 54.

The carrier frequency correction value generation unit 54 is an integrator which integrates the amount of the carrier frequency error estimated by the GI correlation calculation unit 53 and outputs, as a carrier frequency correction value, the integration result to the carrier frequency correction unit 52.

The clock frequency error detection unit 55 estimates a clock frequency error contained in a frequency-domain OFDM signal supplied from the FFT calculation unit 33. The clock frequency error contained in the frequency-domain OFDM signal is estimated based on, for example, a phase difference between pilot symbols of the OFDM.

In the OFDM, respective subcarriers are arranged at a predetermined frequency interval, and the larger the subcarrier number, the higher the frequency. In the case where there is no clock frequency error, only a phase error caused by channel noise, etc. is included in the frequency-domain OFDM signal. Accordingly, the phase error of each pilot carrier is substantially constant.

Conversely, in the case where there is a clock frequency error, the phase error caused by the clock frequency error is included in the phase error of the pilot carrier in addition to the phase error caused by the channel noise, etc. The larger the subcarrier number and the higher the frequency of the pilot carrier, the larger the phase error caused by the clock frequency error. That is, the phase error caused by the clock frequency error is proportional to the subcarrier number.

The clock frequency error detection unit 55 detects the phase error proportional to the subcarrier number and estimates the clock frequency error. The technology of estimating the clock frequency error is disclosed, for example, in Japanese Patent Application Laid-Open No. 2010-87749. The clock frequency error detection unit 55 outputs the estimated amount of the clock frequency error to the clock frequency correction value generation unit 56.

The clock frequency correction value generation unit 56 is an integrator which integrates the amount of the clock frequency error estimated by the clock frequency error detection unit 55 and outputs, as a clock frequency correction value, the integration result to the clock frequency correction unit 51.

Figure 13:
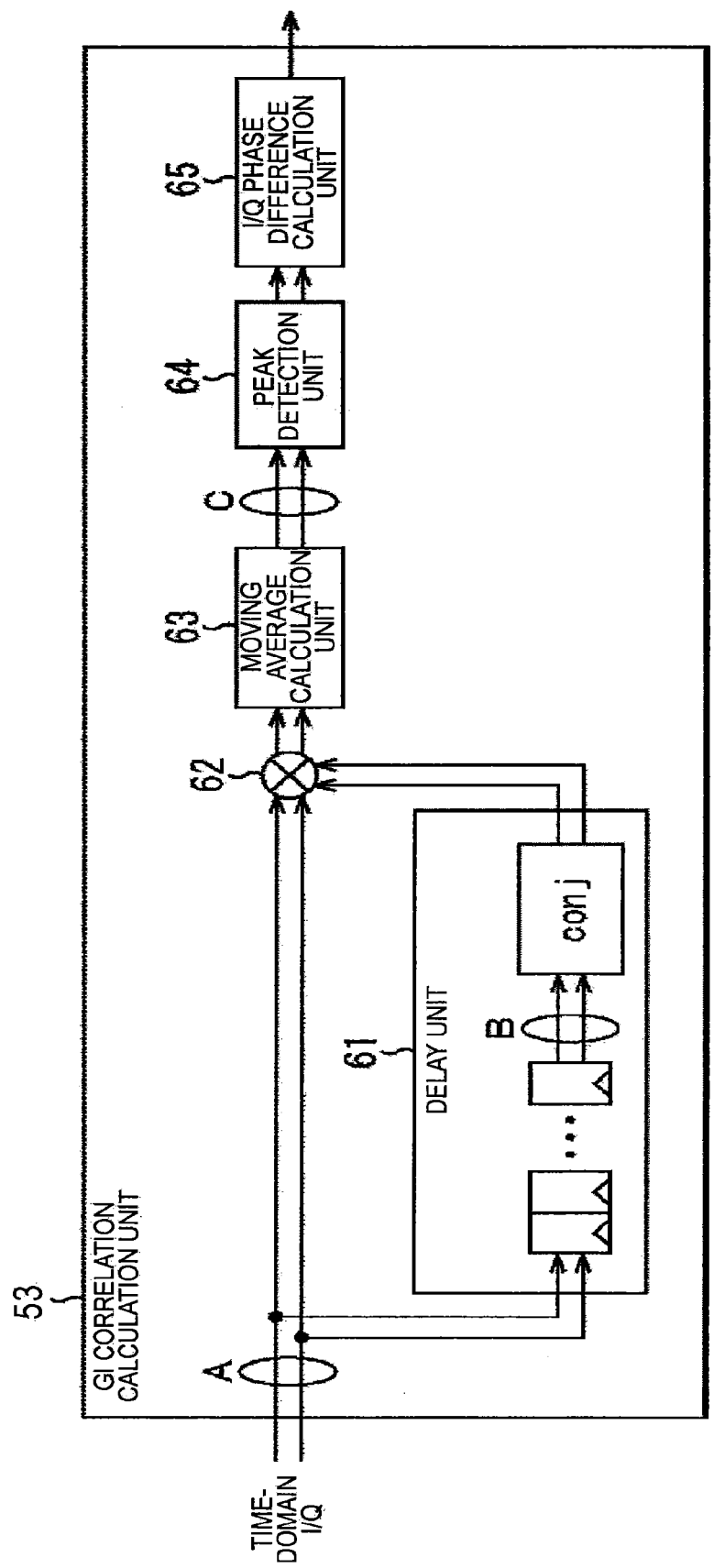
FIG. 13 is a block diagram illustrating an exemplary structure of a GI correlation calculation unit.

FIG. 13 is a block diagram illustrating an exemplary structure of the GI correlation calculation unit 53.

The GI correlation calculation unit 53 includes a delay unit 61, a multiplication unit 62, a moving average calculation unit 63, a peak detection unit 64, and an I/Q phase difference calculation unit 65. The time-domain OFDM signal output from the carrier frequency correction unit 52 is input to the delay unit 61 and the multiplication unit 62.

The delay unit 61 delays the input time-domain OFDM signal by the length of the effective symbol and then outputs, to the multiplication unit 62, the delayed signal transposed to complex conjugate (Conj).

The multiplication unit 62 obtains a multiplication value by multiplying the input time-domain OFDM signal by the delayed signal delayed by the delay unit 61 and then outputs the multiplication value to the moving average calculation unit 63.

The moving average calculation unit 63 obtains, as the GI correlation, a moving average per time duration corresponding to the GI length of the multiplication value supplied from the multiplication unit 62 and, after that, outputs the GI correlation to the peak detection unit 64.

The peak detection unit 64 detects a peak point of the GI correlation and outputs information related to phases of an I component and a Q component at the peak point to the I/Q phase difference calculation unit 65. The information related to the peak point is also supplied to the FFT calculation unit 33 so that a subject period for FFT calculation is set.

The I/Q phase difference calculation unit 65 outputs, to the carrier frequency correction value generation unit 54, information regarding the carrier frequency error represented by a phase difference between the I component and the Q component at the peak point detected by the peak detection unit 64.

A description will be given for influence of the carrier frequency error.

Figure 14:
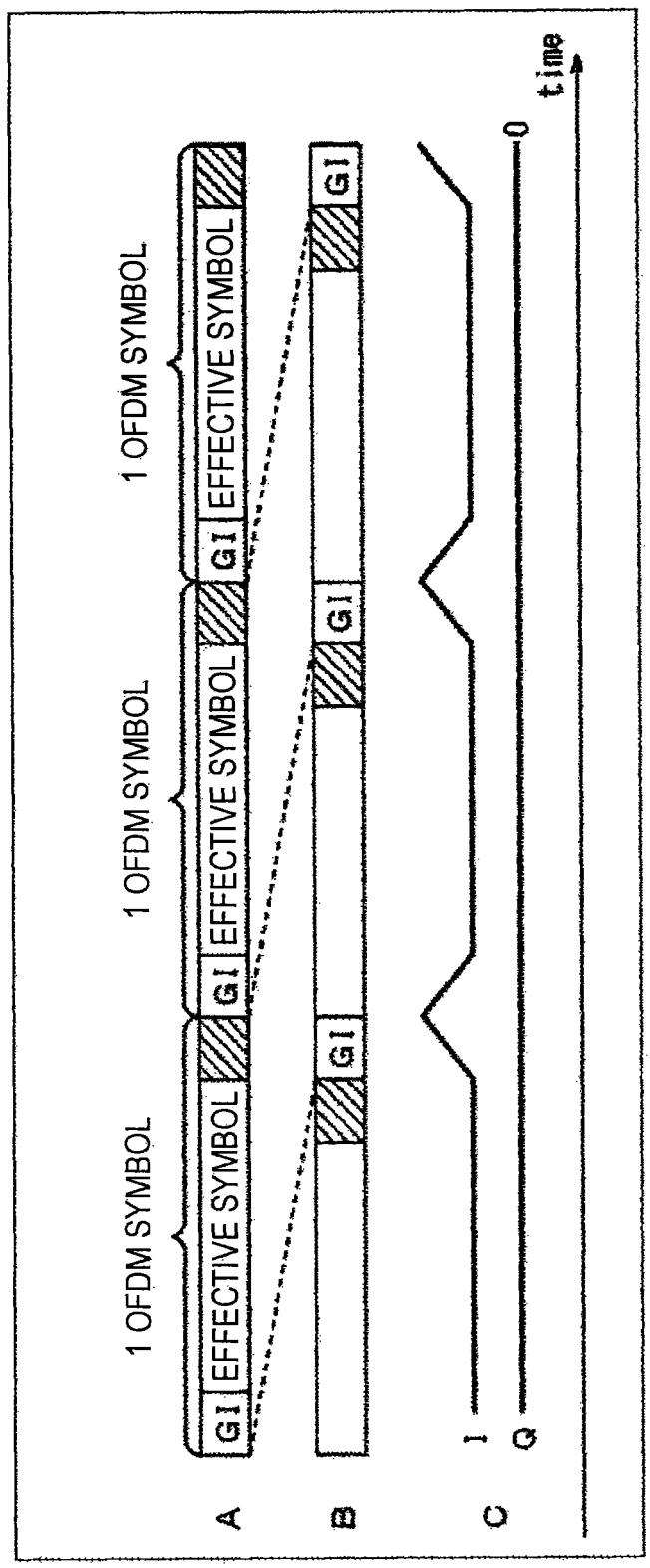
FIG. 14 is a diagram illustrating examples of signals observed at respective positions illustrated in FIG. 13.

FIG. 14 is a diagram illustrating examples of signals at respective positions A, B, and C in FIG. 13. The position A is where an input signal is observed, and the position B is where a delay signal is observed. The position C is where a moving average of the GI correlation is observed. A horizontal direction represents the time direction.

As illustrated in the upper portion of FIG. 14, one OFDM symbol includes an effective symbol and a guard interval (GI). The effective symbol is a signal period during which an IFFT process is performed at the time of transmission. The guard interval (GI) is a portion where a partial wave in the latter part of the effective symbol shown in shaded area is exactly copied at a head of the effective symbol.

In FIG. 14, the upper portion shows an input signal, and the middle portion shows a delay signal. In the case where there is no carrier frequency error, the GI correlation of the I component takes a peak point at the boundary of the OFDM symbols in the input signal as illustrated in the lower portion of FIG. 14.

On the other hand, in the case where there is a carrier frequency error Δf, the GI correlation is expressed by a formula (2) shown below in the case where the input signal r(t) is expressed by an formula (1). t represents the time. $r_B(t)$ in the formula (1) represents the input signal in the case where there is no carrier frequency error, and Tu in the formula (2) represents the effective symbol length.

[Formula 1]
$$r(t) = r_B(t)e^{j2\pi\Delta ft} \quad (1)$$

[Formula 2]
$$r(t) \cdot r^*(t - Tu) = r_B(t)e^{j2\pi\Delta ft} \cdot r_B^*(t - Tu)e^{-j2\pi\Delta f(t-Tu)} \quad (2)$$
$$= |r_B(t)|^2 e^{+j2\pi\Delta fTu}$$

Figure 15:
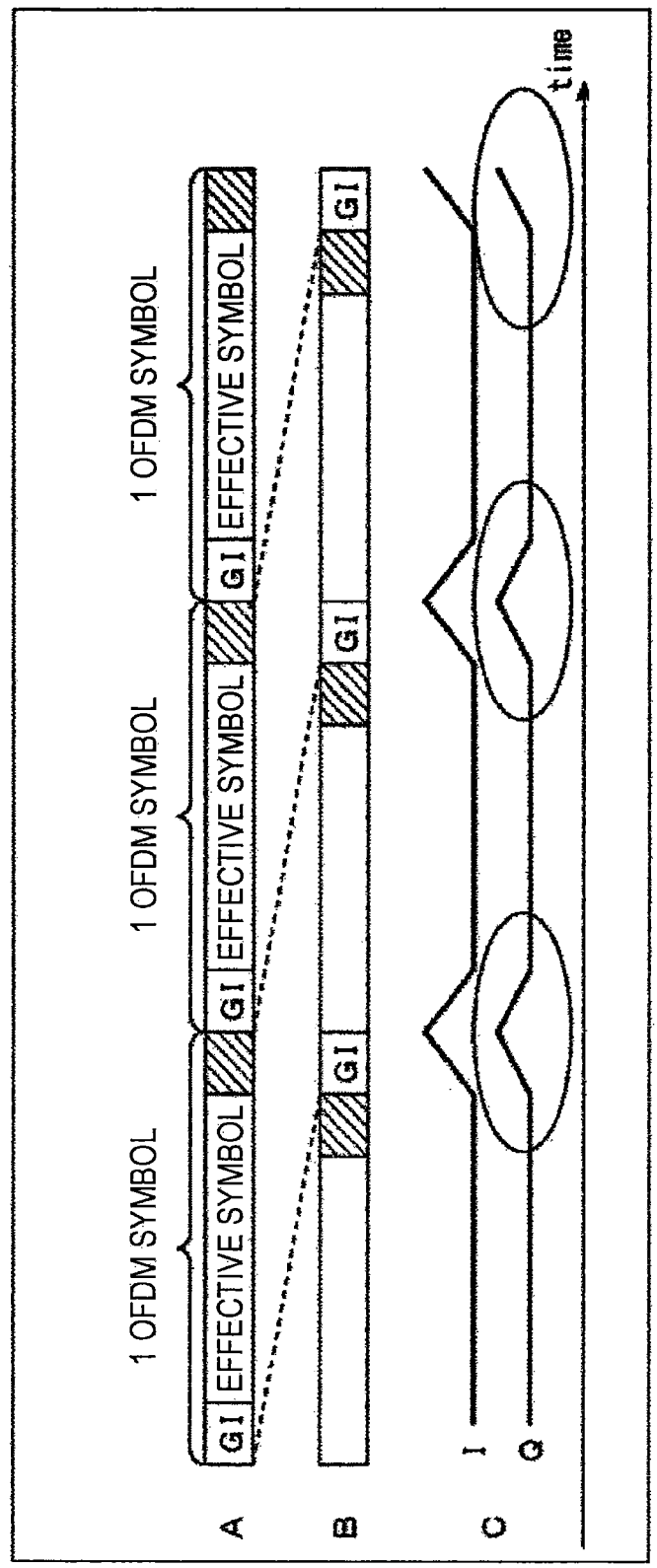
FIG. 15 is a diagram illustrating other examples of signals observed at the respective positions illustrated in FIG. 13.

According to $e^{+j2\pi\alpha fTu}$ in the formula (2), it is clear that rotation proportional to the carrier frequency error Δf occurs in the I component and the Q component at the peak point of the GI correlation. FIG. 15 is a diagram illustrating examples of signals in the case where there is a carrier frequency error. As illustrated in the lower portion of FIG. 15, the GI correlation takes a peak also in the Q component.

Next, a description will be given for influence of the clock frequency error.

Figure 16:
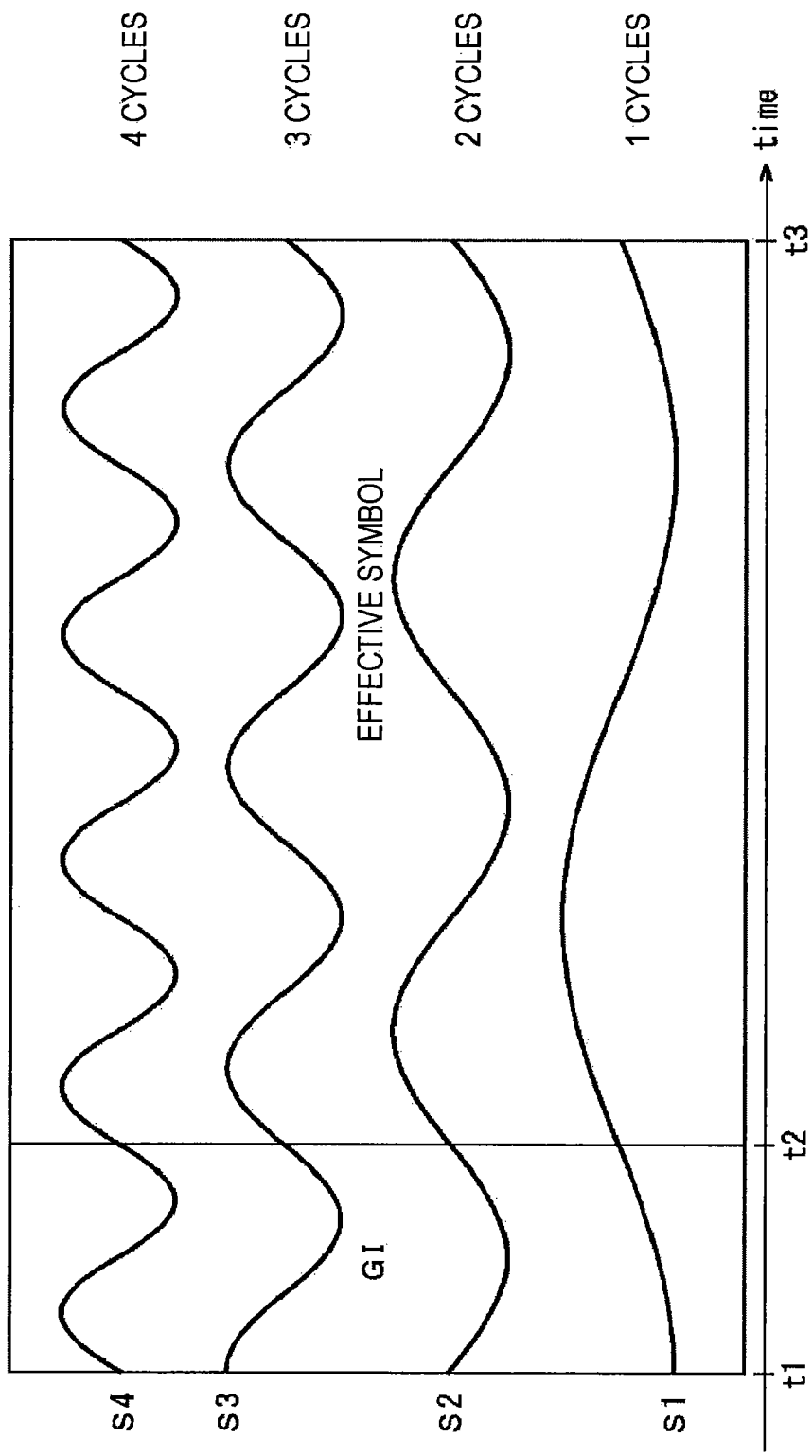
FIG. 16 is a diagram illustrating OFDM signal waveforms.

FIG. 16 is a diagram illustrating OFDM signal waveforms. The OFDM signal is considered as a group of four sine waves of signals S1 to S4. The signals S1 to S4 correspond to respective carriers.

A period from time t1 to t2 corresponds to a period of the GI, and a period from time t2 to t3 corresponds to a period of the effective symbol. In the period of the effective symbol in the signal S1, one cycle of the sine wave is included, and in the period of the effective symbol in the signal S2, two cycles of the sine waves are included. In the period of the effective symbol in the signal S3, three cycles of the sine waves are included, and in the period of the effective symbol in the signal S4, four cycles of the sine waves are included.

Figure 17:
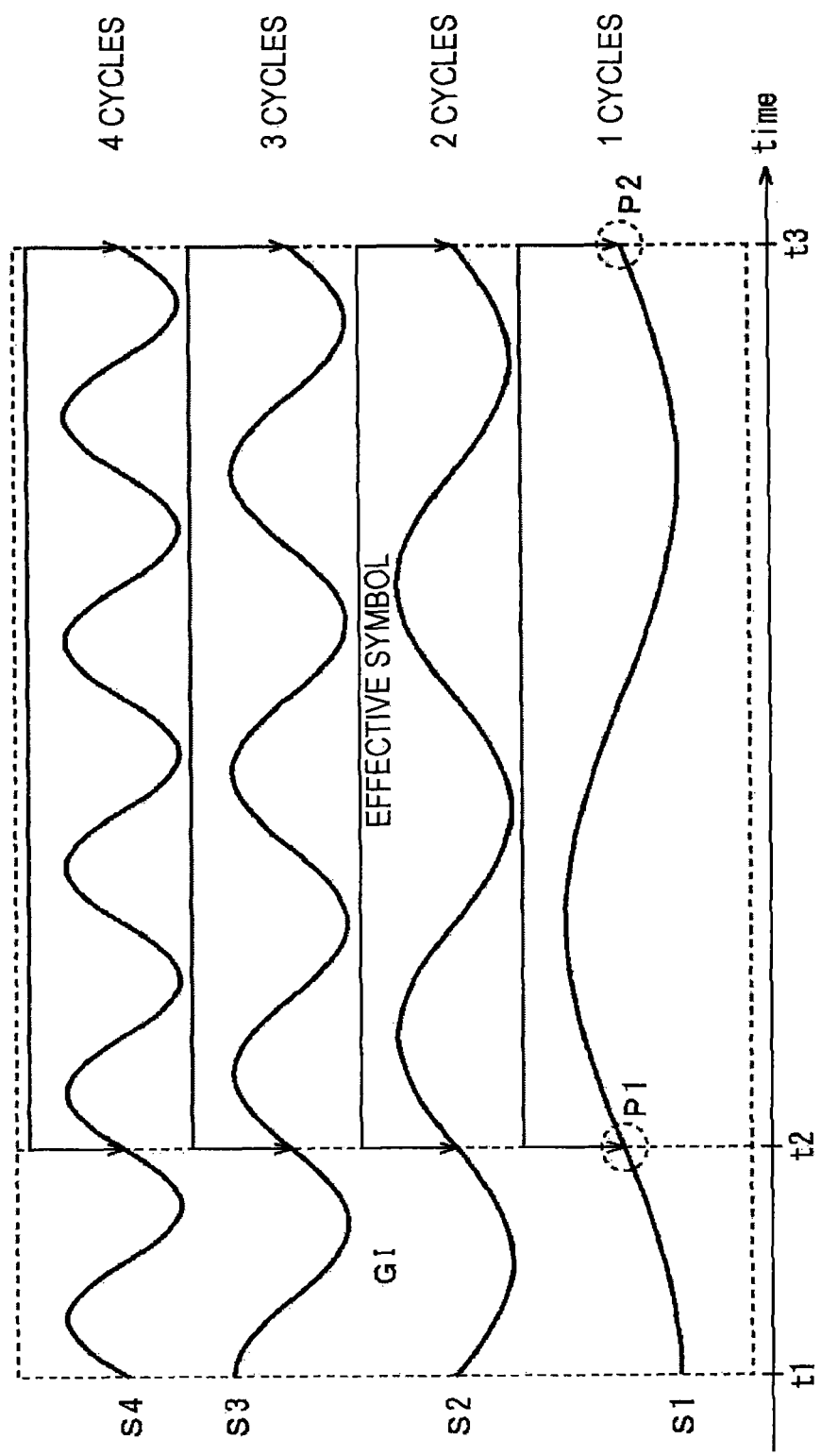
FIG. 17 is a diagram illustrating OFDM signal waveforms without error.

As shown by the arrows in FIG. 17, the GI correlation corresponds to a value obtained by multiplying a signal in a predetermined position of each carrier by a signal which has been delayed by a length of an effective symbol. Accordingly, in the case where there is neither carrier frequency error nor clock frequency error, there will be no phase difference between the signals to be multiplied and the GI correlation is generated only in the I component. In the signal S1 in FIG. 17, there is no phase difference between the signal phase at a position P1 and the signal phase at a position P2. The position P1 is the boundary between the GI and the effective symbol, and the position P2 is the end of the effective symbol.

Figure 18:
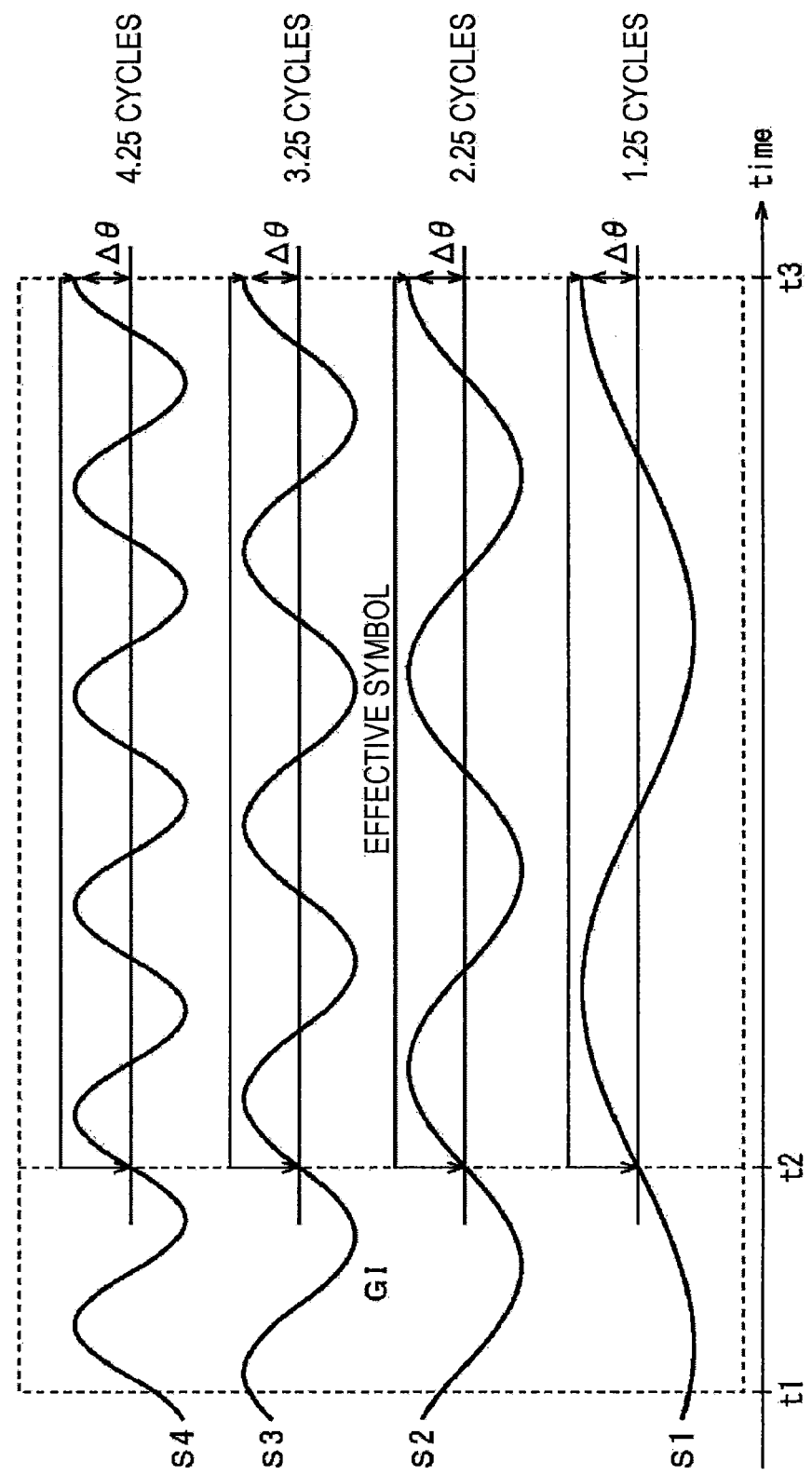
FIG. 18 is a diagram illustrating OFDM signal waveforms with carrier frequency errors.

FIG. 18 is a diagram illustrating waves in the case where there is a carrier frequency error of 0.25 carrier. There is no clock frequency error.

In this case, a fixed phase difference Δθ is identically generated, in all carriers, between a phase of a signal at a predetermined position and a phase of a signal delayed by a length of an effective symbol. In the period of the effective symbol in the signal S1, 1.25 cycles of the sine waves are included. In the period of the effective symbol in the signal S2, 2.25 cycles of the sine waves are included. In the period of the effective symbol in the signal S3, 3.25 cycles of the sine waves are included. In the period of the effective symbol in the signal S4, 4.25 cycles of the sine waves are included.

Figure 19:
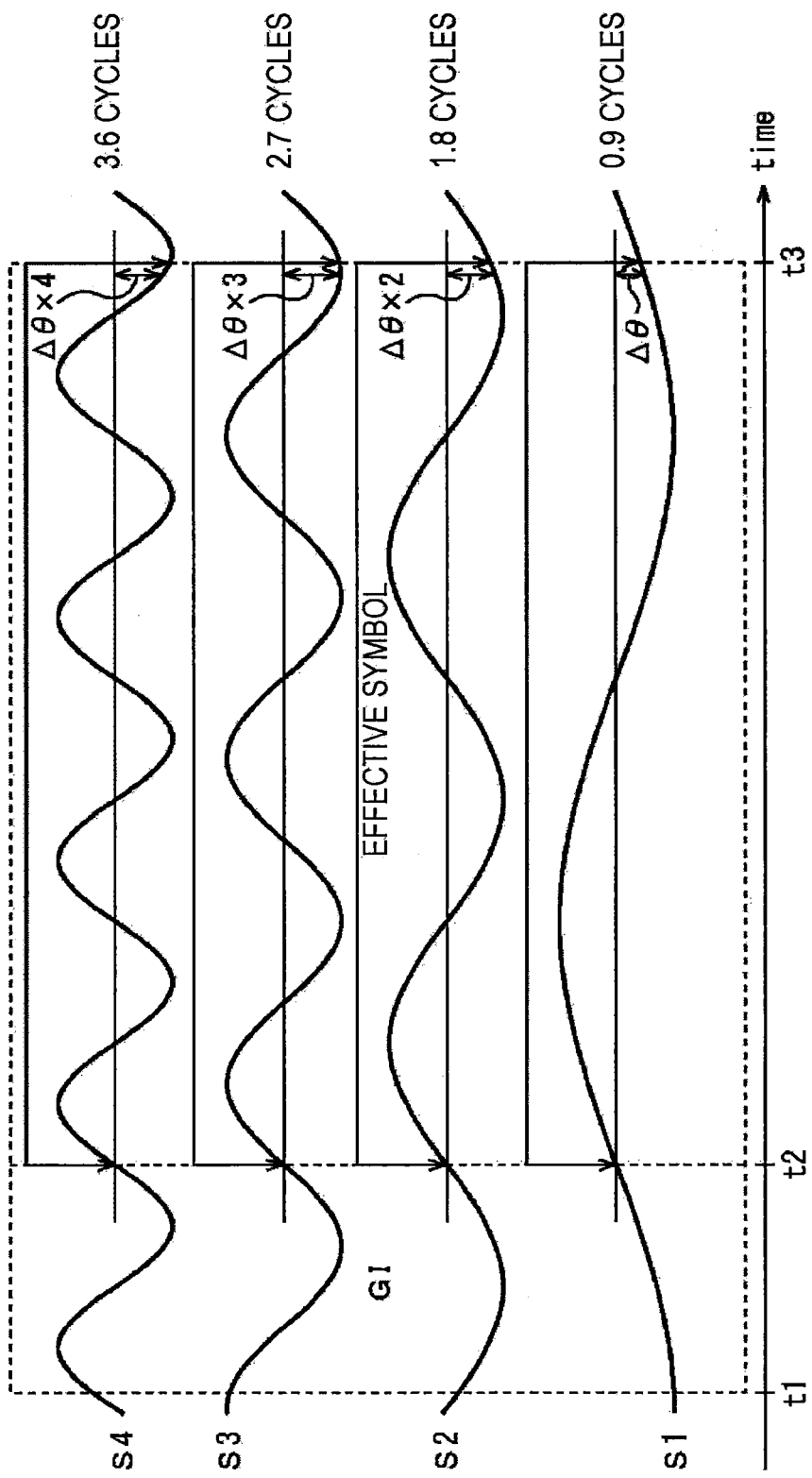
FIG. 19 is a diagram illustrating OFDM signal waveforms with clock frequency errors.

FIG. 19 is a diagram illustrating waves in the case where there is a clock frequency error of ¹⁄₁₀ clock. There is no carrier frequency error.

In this case, a phase difference proportional to the original carrier frequency is generated, in each carrier, between the phase of the signal at the predetermined position and the phase of the signal delayed by the length of the effective symbol.

Assume that, in the signal S1, the phase difference is Δθ between the phase of the signal at the boundary between the GI and the effective symbol and the phase of the signal at the end of the effective symbol. In the signal S2, the phase difference Δθ×2 is generated between the phase of the signal at the boundary between the GI and the effective symbol and the phase of the signal at the end of the effective symbol. In the signal S3, the phase difference Δθ×3 is generated between the phase of the signal at the boundary between the GI and the effective symbol and the phase of the signal at the end of the effective symbol. Further, in the signal S4, the phase difference Δθ×4 is generated between the phase of the signal at the boundary between the GI and the effective symbol and the phase of the signal at the end of the effective symbol.

In the period of the effective symbol in the signal S1, 0.9 cycle of the sine wave is included, and in the period of the effective symbol in the signal S2, 1.8 cycles of the sine wave are included. In the period of the effective symbol in the signal S3, 2.7 cycles of the sine waves are included, and in the period of the effective symbol in the signal S4, 3.6 cycles of the sine waves are included.

Figure 20:
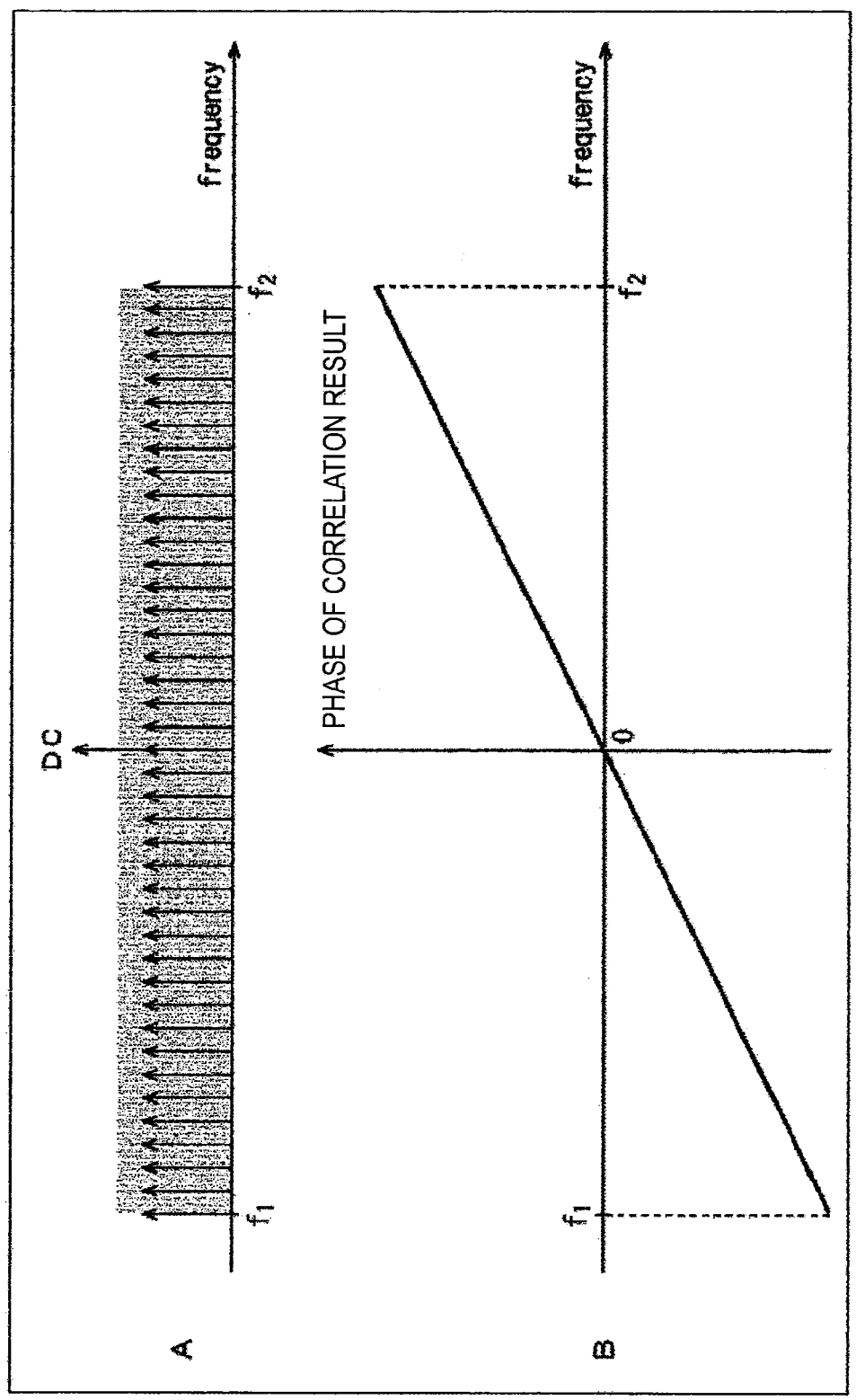
FIG. 20 is a diagram illustrating a relation between frequency and phase difference.

FIG. 20 is a diagram illustrating a relation between the frequency and the phase difference in the case where there is only a clock frequency error. FIG. 20A is a diagram illustrating distribution of OFDM carriers. As illustrated in FIG. 20B, a phase difference of the GI correlation is proportional to the carrier frequency (carrier number).

Assuming that a band of frequency $f_1$ to $f_2$ in FIG. 20 is a band of DVB-C2 tuning window, in the case where there is only the clock frequency error when the OFDM signal is included across the band of the received signal, a phase difference of the GI correlation proportional to the carrier number is generated as illustrated in FIG. 20B.

Figure 21:
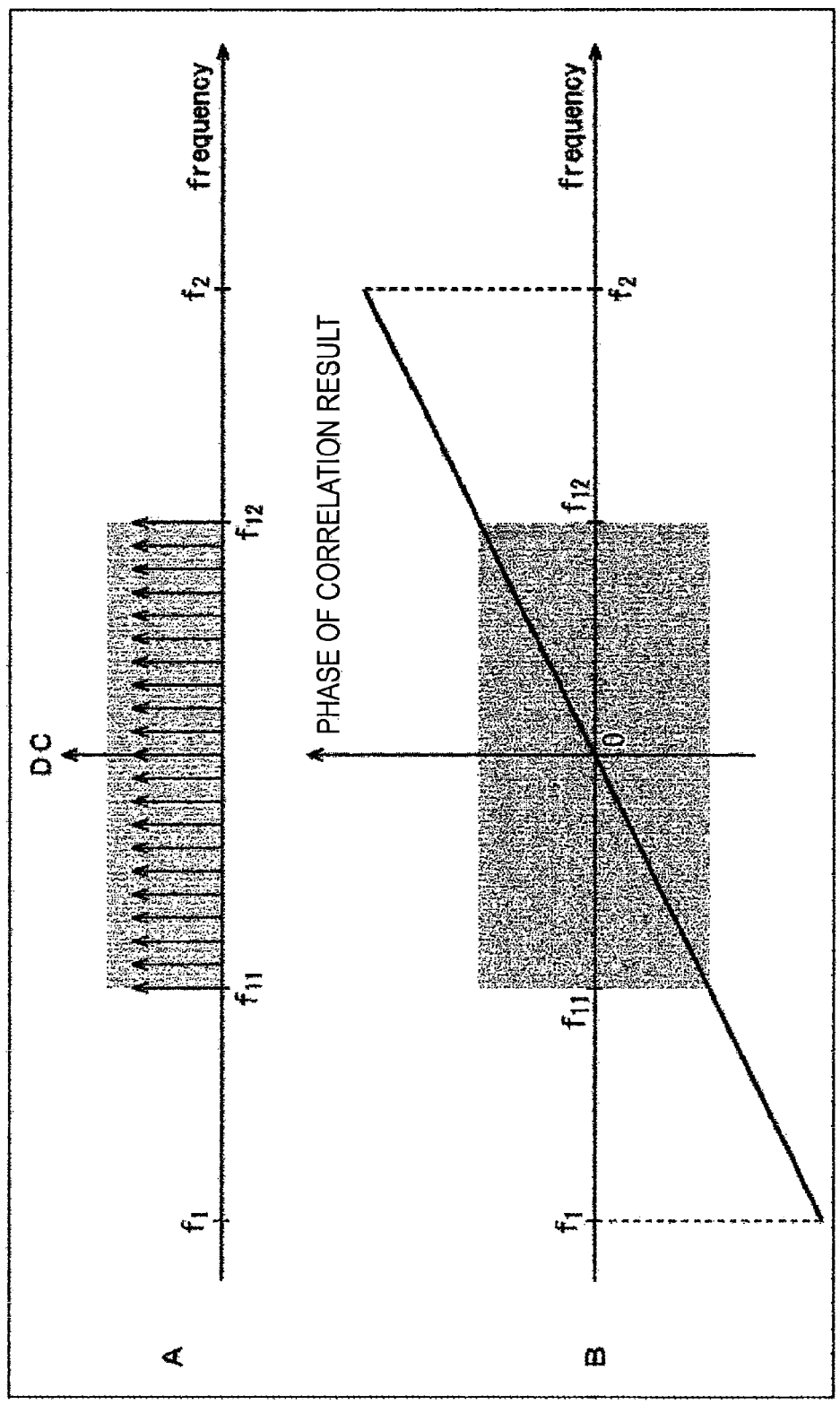
FIG. 21 is another diagram illustrating the relation between the frequency and the phase difference.

Now, let us consider a case where there is only the clock frequency error when the OFDM signal is included only in a part of band of the received signal. As illustrated in FIG. 21A, in the case where the OFDM signal is symmetrically distributed with respect to the center frequency in the band of frequency $f_1$ to $f_2$, namely the band of the received signal, a phase difference shown in a colored range of frequency $f_{11}$ to $f_{12}$ in FIG. 21B is detected by the I/Q phase difference calculation unit 65 and integrated by the carrier frequency correction value generation unit 54. The integration result by the carrier frequency correction value generation unit 54 becomes zero, and it is determined that there is no carrier frequency error.

Here, the determination result by the carrier frequency correction value generation unit 54 is correct because the consideration is given to the case where there is only the clock frequency error. In the carrier frequency correction unit 52, a suitable process is performed in accordance with a current state of the carrier frequency error. Specifically, no correction is performed in the carrier frequency correction unit 52 as the carrier frequency error is zero.

Figure 22:
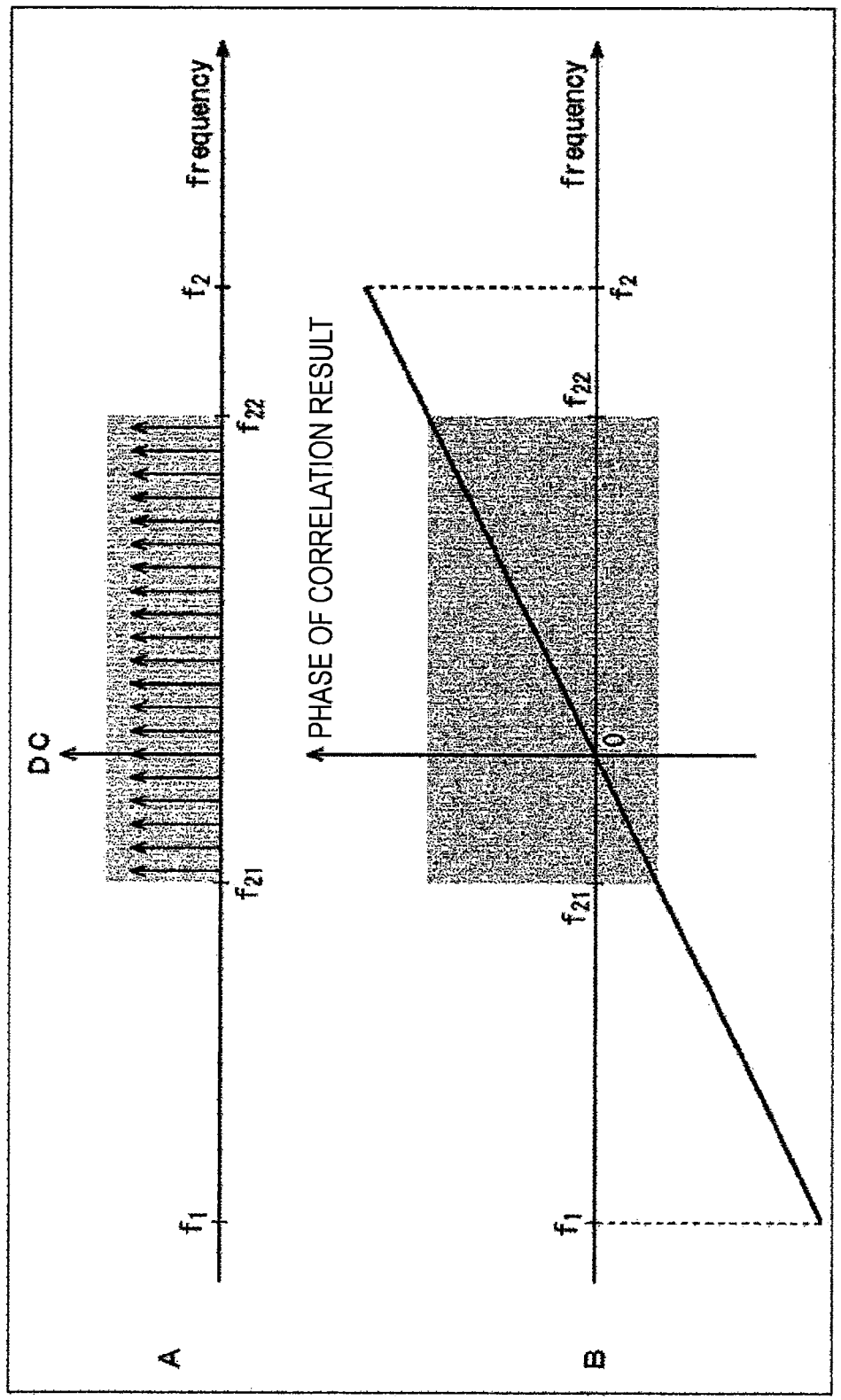
FIG. 22 is still another diagram illustrating the relation between the frequency and the phase difference.

Conversely, as illustrated in FIG. 22A, in the case where the OFDM signal is not symmetrically distributed with respect to the center frequency in the band of frequency $f_1$ to $f_2$, namely the band of the received signal, and the band of the OFDM signal is in a biased position, a phase difference shown in a colored range of frequency $f_{21}$ to $f_{22}$ in FIG. 22B is detected by the carrier frequency correction value generation unit 54 and integrated by the carrier frequency correction value generation unit 54. The integration result by the carrier frequency correction value generation unit 54 does not become zero, and it is determined that there are as many carrier frequency errors as the results of the integration.

Here, the determination result in the carrier frequency correction value generation unit 54 is not correct because the case where there is only the clock frequency error is considered. In the carrier frequency correction unit 52, a process unsuitable to the current state of the current carrier frequency error is performed. Specifically, correction is performed in the carrier frequency correction unit 52 to correct as many carrier frequency errors as the results of the integration although the actual carrier frequency error is zero.

In the case where the band of the OFDM signal is in the biased position in the band of the received signal, correction is thus performed not conforming to the actual state of the carrier frequency error. This results in degradation of reception performance by comparison to the case where the band of the OFDM signal is not in a biased position.

In other words, in the case where the band of the desired OFDM signal included in a part of the band of the received signal is in a biased position, reception performance may be improved by resolving the biased position and performing down-conversion so that the band of the desired OFDM signal may be symmetrically positioned with reference to the center frequency in the band of the received signal.

Modified Examples

Figure 23:
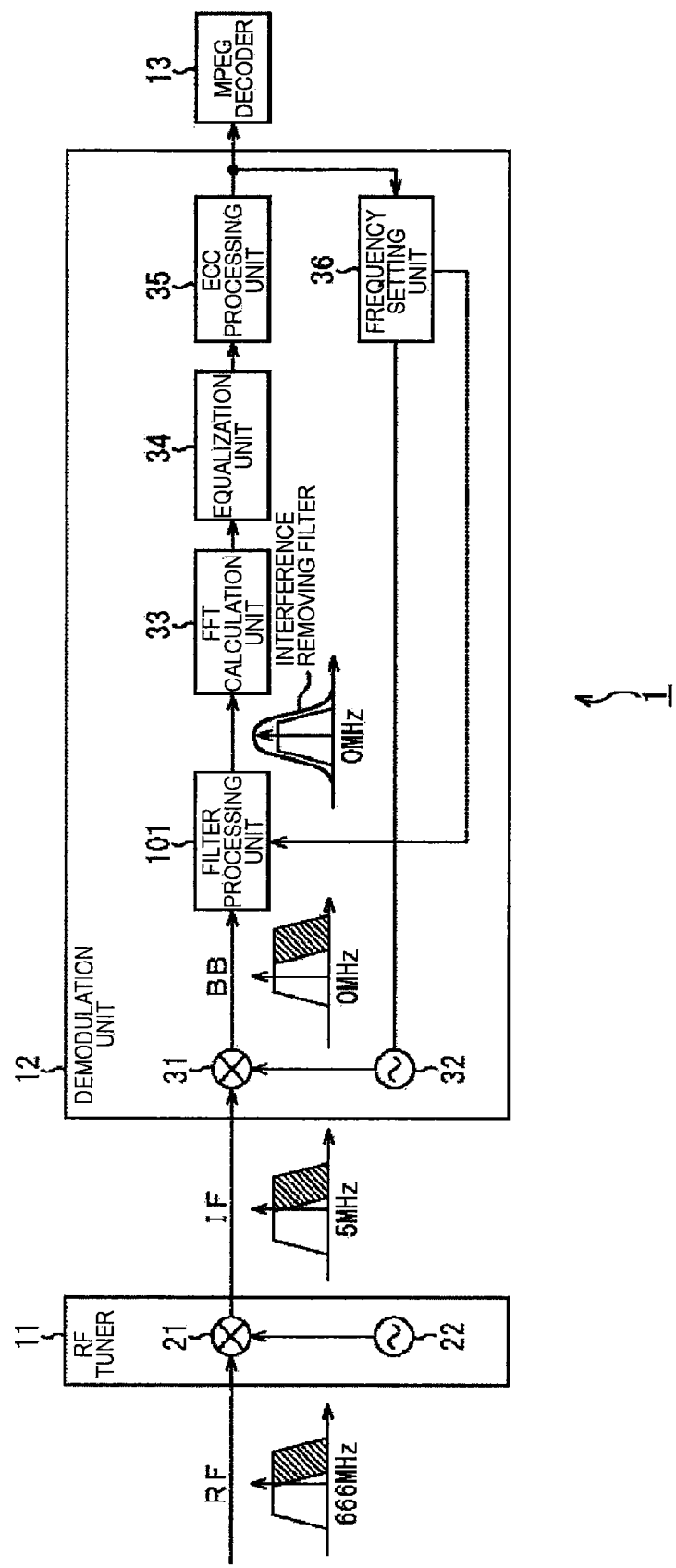
FIG. 23 is a block diagram illustrating a second exemplary structure of the receiving device.

FIG. 23 is a block diagram illustrating a second exemplary structure of the receiving device 1.

The components illustrated in FIG. 23 identical to those illustrated in FIG. 4 are denoted by the same reference numerals. Therefore, overlapping description will be omitted as appropriate. The structure of the receiving device 1 illustrated in FIG. 23 is a subsequent stage of an orthogonal demodulation unit 31 and differs from the structure illustrated in FIG. 4 in that a filter processing unit 101 is provided in a previous stage of an FFT calculation unit 33.

The orthogonal demodulation unit 31 in a demodulation unit 12 orthogonally demodulates an IF signal supplied from a frequency conversion unit 21 in an RF tuner 11. The orthogonal demodulation unit 31 outputs, to the filter processing unit 101, a time-domain baseband signal obtained by the orthogonal demodulation.

In the example illustrated in FIG. 23, a desired OFDM signal is included in a part of a band of a received signal as described with reference to FIG. 7. A baseband signal supplied from the filter processing unit 101 is a signal obtained by down-converting the IF signal, and a DC component of the baseband signal is to be a center frequency in a band of the desired OFDM signal.

The filter processing unit 101 suppresses, by a low-pass filter, a signal in a band adjacent to the band of the desired OFDM signal and other than the band of the desired OFDM signal based on information related to the desired OFDM signal supplied from a frequency setting unit 36. The filter processing unit 101 outputs, to the FFT calculation unit 33, the baseband signal for which the signal in a band other than the band of the desired OFDM signal has been suppressed.

The FFT calculation unit 33 performs FFT calculation to the baseband signal supplied from the filter processing unit 101 and outputs the frequency-domain baseband signal.

The frequency setting unit 36 specifies the band of the OFDM signal included in the received signal based on the L1 information supplied from the ECC processing unit 35 and then outputs information related to the band of the OFDM signal to the filter processing unit 101.

It can be assumed that some disturbance exists outside the band of the desired OFDM signal. Such disturbance is preferably suppressed in advance by a filtering process. For example, in the case where a signal with high power exists as the disturbance and no suppression has been carried out for such a signal, overflow occurs in FFT calculation, and this may result in degradation of reception performance. Accordingly, by having suppressed the disturbance before the FFT calculation, the overflow in the FFT calculation may be avoided and the reception performance may be improved. By down-converting a signal to be processed to the baseband signal before the filtering process as described above, the filtering process may be performed by using a low-pass filter which adopts not a complex number coefficient but a real number coefficient, and this results in reduction of a circuit scale.

The placement of the filter processing unit 101 may be in a previous stage of the orthogonal demodulation unit 31 in the demodulation unit 12, or may be in another place, such as inside the RF tuner 11.

Figure 24:
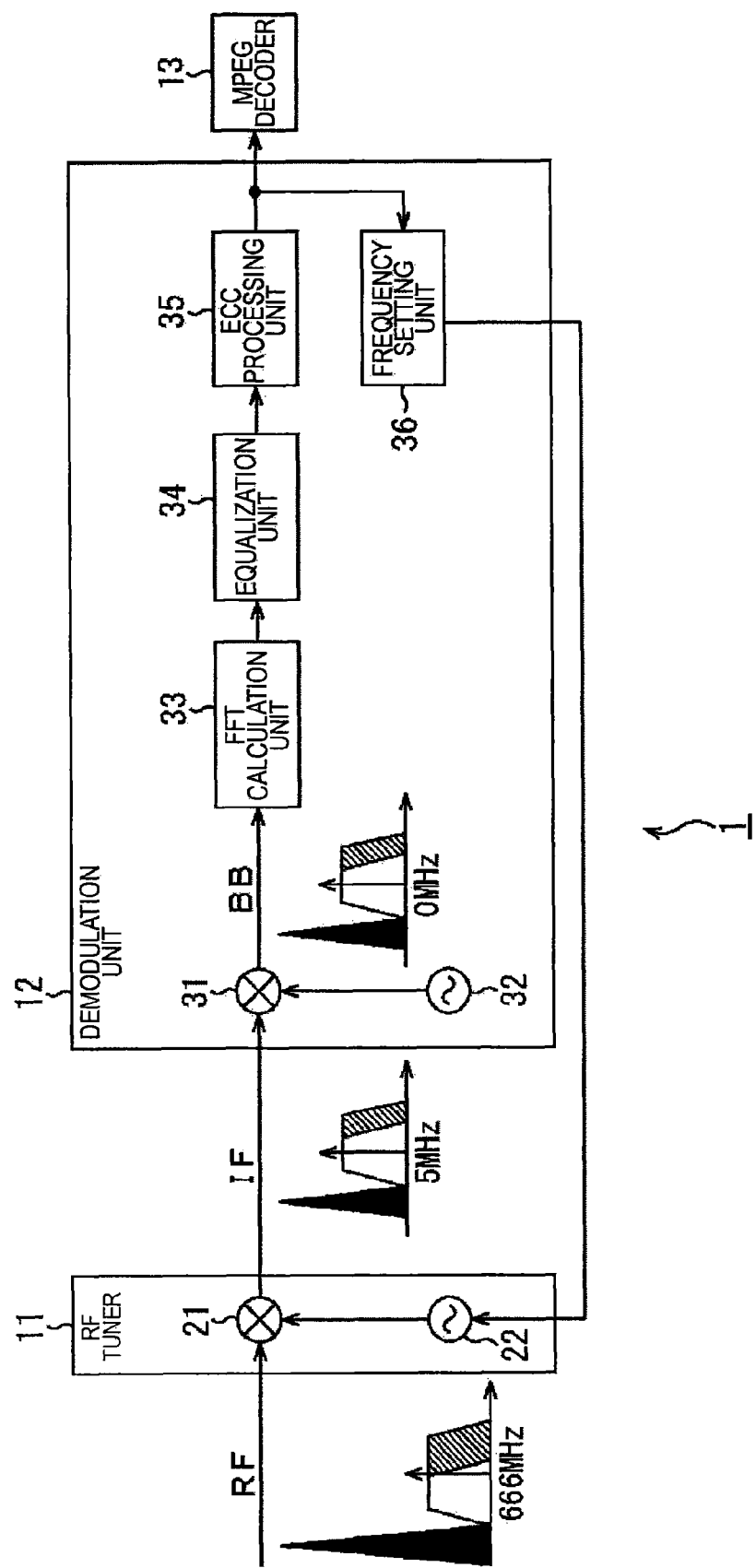
FIG. 24 is a block diagram illustrating a third exemplary structure of the receiving device.

FIG. 24 is a block diagram illustrating a third exemplary structure of the receiving device 1. The components illustrated in FIG. 24 identical to those illustrated in FIG. 4 are denoted by the same reference numerals. Therefore, overlapping description will be omitted as appropriate.

In the receiving device 1 in FIG. 24, in the case where a band of a desired OFDM signal is included only in a part of a band of a received signal, a process for resolving a biased position of the band of the desired OFDM signal is performed at the stage of converting an RF signal to an IF signal.

In the case where the desired OFDM signal is included only in a part of the band of the received signal, the frequency setting unit 36 specifies, based on the L1 information, a center frequency in the band of the desired OFDM signal included in the band of the received signal, and outputs information related to the center frequency in the band of the desired OFDM signal to an oscillator 22 in the RF tuner 11.

The oscillator 22 in the RF tuner 11 generates a signal of the frequency set by the frequency setting unit 36 and outputs the signal to the frequency conversion unit 21.

The frequency conversion unit 21 receives the input RF signal and converts the frequency of the RF signal based on the signal of the predetermined frequency supplied from the oscillator 22. The frequency conversion unit 21 outputs, to the orthogonal demodulation unit 31, an IF signal obtained from the frequency conversion. The frequency of the IF signal is the same as the center frequency in the band of the desired OFDM signal.

Thus, reception performance may also be improved by resolving the biased position of the band of the OFDM signal not in the stage of orthogonal demodulation of converting the IF signal to the baseband signal but in the stage of converting the RF signal to the IF signal.

Figure 25:
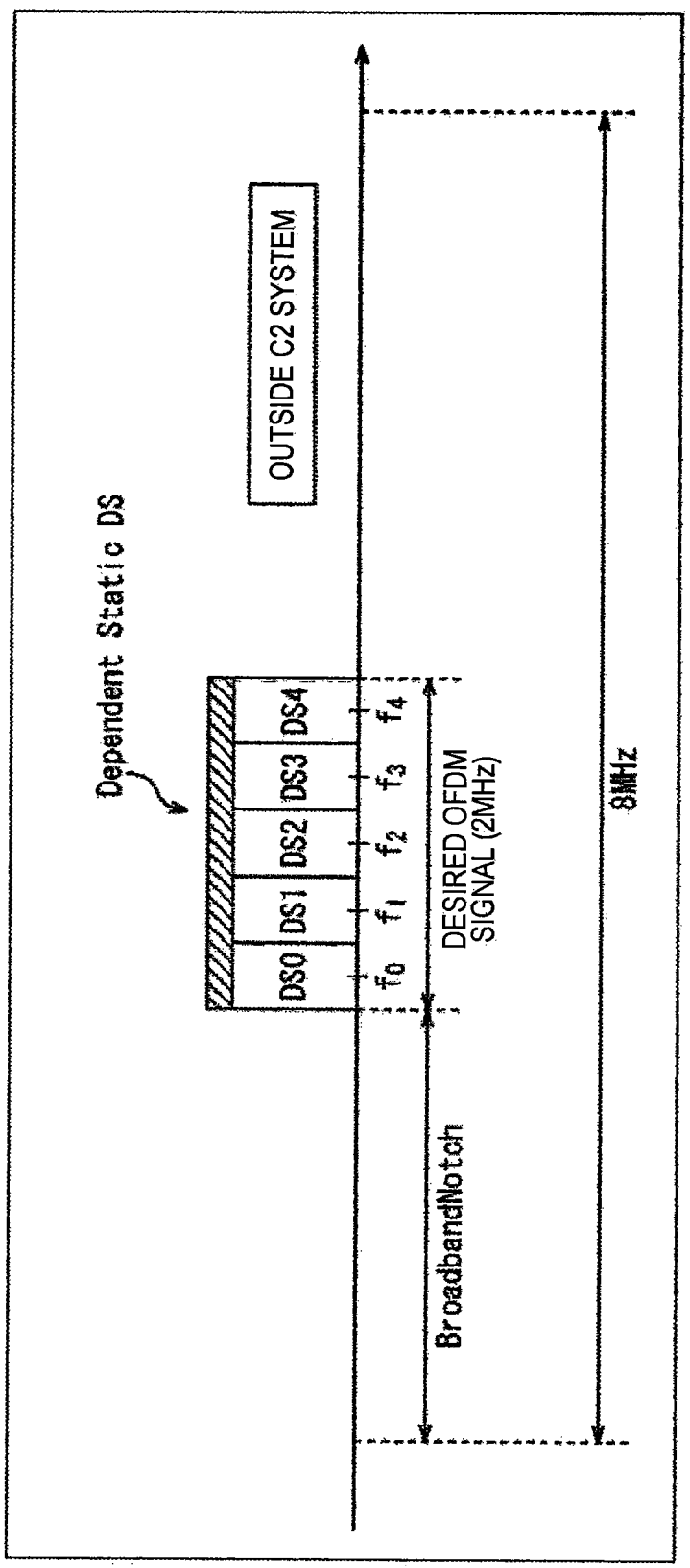
FIG. 25 is a diagram illustrating another example of the band of the received signal.

FIG. 25 is a diagram illustrating another example of shifting the band of the received signal.

As is the case with FIG. 10, a bandwidth of a dependent static DS in FIG. 25 is 2 MHz and includes five data slices DS0 to DS4. A desired data slice to be received is the leftmost DS0. The left end of the dependent static DS contacts a broadband notch and the right end thereof contacts a band outside a C2 system. The dependent static DS in FIG. 25 is a data slice set at the end of the C2 system.

In this case, the frequency setting unit 36 specifies a frequency $f_2$ based on L1 information. The frequency $f_2$ is the center frequency in the band of the desired OFDM signal. The frequency setting unit 36 sets, as a center frequency in the band of the received signal, a predetermined frequency distant from the broadband notch based on the frequency $f_2$. The frequency $f_2$ is the center frequency in the band of the desired OFDM signal. In the example in FIG. 25, a frequency $f_3$ is set as the center frequency in the band of the received signal. The frequency $f_3$ is closer to the band outside the C2 system than the frequency $f_2$. The frequency $f_3$ is a center frequency of DS3.

A bandwidth of the notch included in the band of the received signal may be narrowed by setting the center frequency in the band of the received signal at the frequency closer to the band outside the C2 system than the center frequency in the band of the desired OFDM signal. Consequently, in the case where some disturbance exists in the band of the notch, influence from the disturbance may be reduced.

[Exemplary Structure of the Receiving System]

Figure 26:
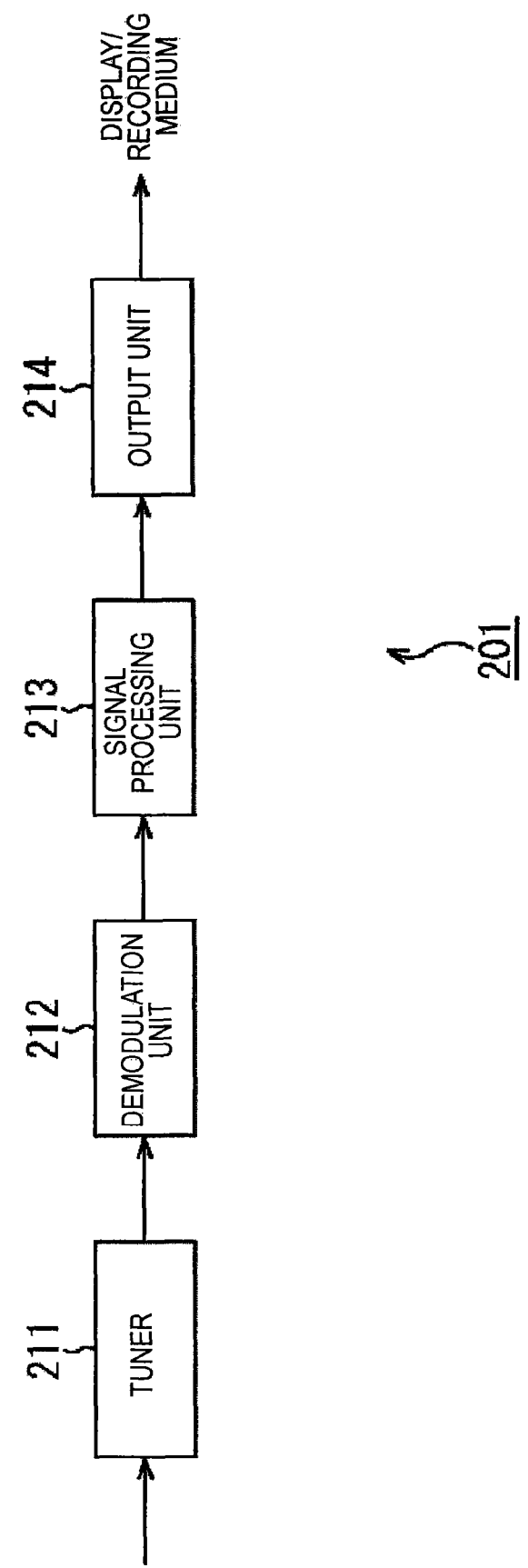
FIG. 26 is a diagram illustrating an exemplary structure of a receiving system.

FIG. 26 is a block diagram illustrating an exemplary structure of a receiving system to which the receiving device 1 is applied.

A receiving system 201 illustrated in FIG. 26 includes a tuner 211, a demodulation unit 212, a signal processing unit 213, and an output unit 214.

The tuner 211 receives a signal transmitted via a channel, such as digital terrestrial broadcasting, digital satellite broadcasting, CATV network, or the Internet, and outputs the received signal to the demodulation unit 212. The above-described RF tuner 11 is included in the tuner 211.

The demodulation unit 212 performs, for the signal supplied from the tuner 211, channel decoding including demodulation and error correction and then outputs the data obtained from the channel decoding to the signal processing unit 213. The above-described demodulation unit 12 is included in the demodulation unit 212.

The signal processing unit 213 performs signal processing, such as decompression and descrambling, for the data obtained from channel decoding as appropriate and acquires data to be transmitted. The above-described MPEG decoder 13 is included in the signal processing unit 213.

The decompression by the signal processing unit 213 is performed in the case where data to be transmitted, such as video or audio, has been compressed by the transmitting side, using the MPEG or other predetermined compression method. Further, the descrambling is performed in the case where the data to be transmitted has been scrambled by the transmitting side. The signal processing unit 213 outputs, to the output unit 214, the data to be transmitted which has been obtained by suitably performing the signal processing.

The output unit 214 performs a process, such as D/A conversion, for the data supplied from the signal processing unit 213 when displaying an image based on the data supplied from the signal processing unit 213. The output unit 214 outputs the image signal obtained from the D/A conversion to a display provided in the receiving system 201 or a display outside the receiving system 201, to display the image.

Further, in the case of recording the data supplied from the signal processing unit 213 on a recording medium, the output unit 214 outputs the data supplied from the signal processing unit 213 to the recording medium inside the receiving system 201 or the recording medium outside the receiving system 201 for recording. The recording medium includes, for example, a hard-disk, a flash memory, or an optical disk. The recording medium outside the receiving system 201 may be not only a recording medium external to the receiving system 201 but also the recording medium connected via a network.

The receiving system 201 having the above-described structure may include hardware, such as an IC (Integrated Circuit) chip. Alternatively, the receiving system 201 may include a component such as a board on which a plurality of IC chips is arranged. Still alternatively, the receiving system 201 may include an independent device that includes the above-mentioned component.

Each of the tuner 211, the demodulation unit 212, the signal processing unit 213, and the output unit 214 may be configured as single independent hardware or software module. Further, two or more of the tuner 211, the demodulation unit 212, the signal processing unit 213, and the output unit 214 may be combined as the single independent hardware or the software module. For example, the tuner 211 and the demodulation unit 212 may be configured of a single piece of hardware, and the signal processing unit 213 and the output unit 214 may be configured of a single piece of hardware.

The receiving system 201 is applicable, for example, to a television set to receive digital television broadcasting, a radio receiver to receive radio broadcasting, and a recorder to record television broadcasting.

[Exemplary Structure of Computer]

The above-described series of processes may be performed by either hardware or software. In a case where the series of processes is performed by the software, a program constituting the software is installed from a program recording medium into a computer incorporated into dedicated hardware, a general-purpose personal computer, or the like.

FIG. 27 is a block diagram illustrating an exemplary structure of computer hardware which executes the above-described series of processes by the program.

A CPU (Central Processing Unit) 251, a ROM (Read Only Memory) 252, and a RAM (Random Access Memory) 253 are mutually connected via a bus 254.

The bus 254 is further connected to an input/output interface 255. An input unit 256 and an output unit 257 are connected to the input/output interface 255. The input unit 256 includes, for example, a keyboard and a mouse. The output unit 257 includes, for example, a display and a speaker. Further, a storage unit 258, a communication unit 259 and a drive 260 are also connected to the input/output interface 255. The storage unit 258 includes, for example, a hard disk or a nonvolatile memory. The communication unit 259 includes, for example, a network interface. The drive 260 drives a removable medium 261.

In the computer having the above-described structure, the above-described series of processes is performed by the CPU 251 loading a program, stored in the storage unit 258, into the RAM 253 via the input/output interface 255 and the bus 254 for execution.

The program executed by the CPU 251 is recorded, for example, on the removable medium 261, or provided via a wired or wireless transmission medium such as a local area network, the Internet or digital broadcasting, and is installed on the storage unit 258.

Meanwhile, a program to be executed by the computer may be a program for performing operations in chronological order in accordance with the sequence described in this specification, or may be a program for performing operations in parallel or performing operations when necessary, such as when a call is made.

The embodiments of the present technology are not limited to those described above, but may be modified in various manners without departing from the scope of the present technology.

Modified Examples

The present technology may also include the following configurations.

(1)

A receiving device including:

a demodulation unit configured to convert a received signal to a baseband signal in the case where a first frequency differs from a second frequency, wherein the first frequency is a center frequency in a band of the received signal, the second frequency is a center frequency in a band of a desired signal included in a part of the band of the received signal, and a DC component of the baseband signal is to be a frequency in the vicinity of the second frequency.

(2)

The receiving device according to (1), wherein a band of a signal to be received and a band of an adjacent signal adjacent to the band of the signal to be received are included in the band of the desired signal.

(3)

The receiving device according to (2), wherein in the case where the first frequency differs from the second frequency, the demodulating unit converts the received signal to the baseband signal when either of both ends of the signal to be received is adjacent to the adjacent signal.

(4)

The receiving device according to any one of (1) to (3), further including a setting unit configured to specify the first frequency and the second frequency based on transmission control information contained in the received signal and set a frequency which is to be the DC component of the baseband signal, wherein the demodulation unit converts the received signal in accordance with the frequency set by the setting unit.

(5)

The receiving device according to (4), further including a receiving unit configured to receive a signal with a fixed bandwidth in a predetermined frequency band including the bandwidth of a signal used for transmitting the transmission control information, wherein the demodulation unit converts the received signal received by the receiving unit to the baseband signal.

(6)

The receiving device according to any one of (1) to (5), further including a processing unit configured to suppress a signal in a band other than the band of the desired signal, wherein the demodulation unit converts the received signal, for which the signal has been suppressed by the processing unit, to the baseband signal.

(7)

The receiving device according to any one of (1) to (6), wherein a band whose center frequency is the first frequency is a band of a DVB-C2 tuning window, and the band of the desired signal is a band of an OFDM signal which includes, at least in part, an OFDM signal of a data slice to be received.

(8)

The receiving device according to (7), wherein in the case where the band of the desired signal is interposed between a band outside C2 system and a band of a notch, the demodulation unit converts the received signal to the baseband signal, and a DC component of the baseband signal is to be a frequency closer to the band outside C2 system than the center frequency in the band of the desired signal.

(9)

A receiving method including:

a step of converting a received signal to a baseband signal in the case where a first frequency differs from a second frequency, wherein the first frequency is a center frequency in a band of the received signal, the second frequency is a center frequency in a band of a desired signal contained in a part of the band of the received signal, and a DC component of the baseband signal is to be a frequency in the vicinity of the second frequency.

(10)

A program for causing a computer to perform a process including:

a step of converting a received signal to a baseband signal in the case where a first frequency differs from a second frequency, wherein the first frequency is a center frequency in a band of the received signal, the second frequency is a center frequency in a band of a desired signal contained in a part of the band of the received signal, and a DC component of the baseband signal is to be a frequency in the vicinity of the second frequency.

(11)

A receiving system including:

a receiving unit configured to receive a signal transmitted via a channel so that the signal has a fixed bandwidth in a predetermined frequency band;

a demodulation unit configured to demodulate the received signal received by the receiving unit;

a signal processing unit configured to perform signal processing for data demodulated by the demodulation unit to obtain data to be transmitted; and an output unit configured to output the data to be transmitted obtained by the signal processing unit, wherein the demodulation unit includes a conversion unit configured to convert the received signal to a baseband signal in the case where a first frequency differs from a second frequency, the first frequency is a center frequency in a band of the received signal, the second frequency is a center frequency in a band of a desired signal included in a part of the band of the received signal, and a DC component of the baseband signal is to be a frequency in the vicinity of the second frequency.

REFERENCE SIGNS LIST

1 Receiving device, 11 RF tuner, 12 Demodulation unit, 13 MPEG decoder, 21 Frequency conversion unit, 22 Oscillator, 31 Orthogonal demodulation unit, 32 Oscillator, 33 FFT calculation unit, 34 Equalization unit, 35 ECC processing unit, 36 Frequency setting unit, 101 Filter processing unit

The invention claimed is:

1. A receiving device comprising:
   circuitry configured to
      determine whether a band of a received signal includes a dependent static data slice and a notch;
      in response to a determination that the band of the received signal does not include the dependent static data slice and the notch, convert the received signal to a baseband signal having a DC component located approximately in the center of the band of the received signal; and
      in response to a determination that the band of the received signal includes the dependent static data slice and the notch, convert the received signal to a baseband signal having a DC component located approximately in the center of a band of the dependent static data slice.

2. The receiving device according to claim 1, wherein a band of a desired signal and a band of an adjacent signal adjacent to the band of the desired signal are included in the band of the received signal.

3. The receiving device according to claim 2, wherein when it is determined that the band of the received signal includes the dependent static data slice and the notch, the circuitry converts the received signal to the baseband signal when either of both ends of the desired signal is adjacent to the adjacent signal.

4. The receiving device according to claim 1, further comprising
   circuitry configured to specify the center frequency of the band of the received signal based on transmission control information contained in the received signal and set a frequency which is to be the DC component of the baseband signal,
   wherein the circuitry converts the received signal in accordance with the set frequency.

5. The receiving device according to claim 4, further comprising
   circuitry configured to receive a signal with a fixed bandwidth in a predetermined frequency band including a bandwidth of a signal used for transmitting the transmission control information,
   wherein the circuitry converts the received signal to the baseband signal.

6. The receiving device according to claim 1, further comprising
   circuitry configured to suppress a signal in a band other than the band of the received signal,
   wherein the circuitry converts the received signal, for which the signal has been suppressed, to the baseband signal.

7. The receiving device according to claim 1, wherein the band of the received signal is a band of a DVB-C2 tuning window, and the band of the dependent static data slice is a band of an OFDM signal that includes, at least in part, an OFDM signal of a data slice to be received.

8. The receiving device according to claim 7, wherein in the case where the band of the received signal is interposed between a band outside a C2 system and the notch, the circuitry converts the received signal to the baseband signal having a DC component located closer to the band outside the C2 system than the center frequency in the band of the dependent static data slice.

9. A receiving method comprising:
   determining whether a band of a received signal includes a dependent static data slice and a notch;
   in response to a determination that the band of the received signal does not include the dependent static data slice and the notch, converting the received signal to a baseband signal having a DC component located approximately in the center of the band of the received signal; and
   in response to a determination that the band of the received signal includes the dependent data slice and the notch, converting the received signal to a baseband signal having a DC component located approximately in the center of a band of the dependent static data slice.

10. A non-transitory computer-readable storage medium storing computer-readable instructions thereon, which, when executed by a computer, cause the computer to perform a process comprising:
   determining whether a band of a received signal includes a dependent static data slice and a notch;
   in response to a determination that the band of the received signal does not include the dependent static data slice and the notch, converting the received signal to a baseband signal having a DC component located approximately in the center of the band of the received signal; and
   in response to a determination that the band of the received signal includes the dependent data slice and the notch, converting the received signal to a baseband signal having a DC component located approximately in the center of a band of the dependent static data slice.

11. A receiving system comprising:
   circuitry configured to
      receive a signal transmitted via a channel so that the signal has a fixed bandwidth in a predetermined frequency band;
      demodulate the received signal;
      perform signal processing for demodulated data to obtain data to be transmitted; and
      output the data to be transmitted,
   wherein the circuitry is configured to
      determine whether a band of the received signal includes a dependent static data slice and a notch;
      in response to a determination that the band of the received signal does not include the dependent static data slice and the notch, convert the received signal to a baseband signal having a DC component located approximately in the center of the band of the received signal; and
      in response to a determination that the band of the received signal includes the dependent static data slice and the notch, convert the received signal to a baseband signal having a DC component located approximately in the center of a band of the dependent static data slice.

12. The receiving device according to claim 1, wherein the DC component of the baseband signal is a frequency equal to a center frequency of a band of a desired signal contained in the band of the received signal.

13. The receiving method according to claim 9, wherein the DC component of the baseband signal is a frequency equal to a center frequency of a band of a desired signal contained in the band of the received signal.

14. The non-transitory computer-readable storage medium according to claim 10, wherein the DC component of the baseband signal is a frequency equal to a center frequency of a band of a desired signal contained in the band of the received signal.

15. The receiving system according to claim 11, wherein the DC component of the baseband signal is a frequency equal to a center frequency of a band of a desired signal contained in the band of the received signal.

* * * * *